United States Patent
Malek et al.

(10) Patent No.: US 9,888,562 B2
(45) Date of Patent: Feb. 6, 2018

(54) ELECTROMAGNETIC INTERFERENCE SHIELDING AND STRAIN RELIEF STRUCTURES FOR COUPLED PRINTED CIRCUITS

(71) Applicant: Apple Inc., Cupertino, CA (US)

(72) Inventors: Shayan Malek, San Jose, CA (US); Michael B. Wittenberg, Sunnyvale, CA (US); Sawyer I. Cohen, Sunnyvale, CA (US); Ashutosh Y. Shukla, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 1121 days.

(21) Appl. No.: 13/726,509

(22) Filed: Dec. 24, 2012

(65) Prior Publication Data

US 2014/0177180 A1 Jun. 26, 2014

(51) Int. Cl.
*H05K 1/00* (2006.01)
*H05K 1/02* (2006.01)
*H05K 7/14* (2006.01)
*H05K 9/00* (2006.01)
*H01R 12/79* (2011.01)
(Continued)

(52) U.S. Cl.
CPC ........... *H05K 1/0219* (2013.01); *H01R 12/79* (2013.01); *H01R 13/6595* (2013.01); *H05K 3/368* (2013.01); *H05K 7/142* (2013.01); *H05K 9/0022* (2013.01); *H05K 3/363* (2013.01); *H05K 2201/0311* (2013.01); *H05K 2201/0314* (2013.01); *H05K 2201/09063* (2013.01);
(Continued)

(58) Field of Classification Search
CPC .. H01R 12/79; H01R 13/6595; H05K 1/0219; H05K 3/368; H05K 7/142; H05K 9/0022

USPC ................. 174/250; 361/749, 748
See application file for complete search history.

(56) References Cited

U.S. PATENT DOCUMENTS 4,913,656 A * 4/1990 Gordon .................. H05K 3/365 439/493
5,219,296 A * 6/1993 Nguyen ........... H01R 13/65802 29/832

(Continued)

OTHER PUBLICATIONS

Dolci et al., U.S. Appl. No. 13/623,436, filed Sep. 20, 2012.
Zhu et al., U.S. Appl. No. 13/540,999, filed Jul. 3, 2012.

*Primary Examiner* — Andargie M Aychillhum
(74) *Attorney, Agent, or Firm* — Treyz Law Group, P.C.; G. Victor Treyz; Zachary D. Hadd

(57) ABSTRACT

Electrical components in an electronic device are mounted on substrates such as printed circuits. Printed circuits contain signal paths formed from metal traces. The signal lines in the signal paths of the printed circuits are coupled together using electrical connection structures such as printed circuit board-to-board connectors, contacts joined by anisotropic conductive film, or contacts joined using solder. Electrical connection structures may be surrounded by conductive resilient ring-shaped structures such as conductive foam structures or spring structures. The conductive foam structures may be provided with a metal layer with which the conductive foam structures are soldered to a ring of metal on a printed circuit. Strain relief structures may be formed from an elastomeric ring that surrounds the electrical connection structures or an overmolded plastic structure. Coating layers and conductive plastic may be used in providing strain relief structures with electromagnetic interference shielding capabilities.

23 Claims, 25 Drawing Sheets

(51) Int. Cl.
*H01R 13/6595* (2011.01)
*H05K 3/36* (2006.01)

(52) U.S. Cl.
CPC .............. *H05K 2201/10189* (2013.01); *H05K 2201/10409* (2013.01); *Y10T 29/49126* (2015.01)

(56) References Cited

U.S. PATENT DOCUMENTS

| | | | |
|---|---|---|---|
| 6,410,846 B1 * | 6/2002 | Benn, Jr. ............... | H05K 9/0015 174/389 |
| 6,570,776 B2 * | 5/2003 | MacDonald, Jr. .... | H01L 23/552 174/358 |
| 7,288,727 B1 * | 10/2007 | Garcia .................... | 174/369 |
| 7,375,291 B2 | 5/2008 | Ariel | |
| 7,408,120 B2 * | 8/2008 | Kim ....................... | H05K 1/115 174/260 |
| 7,462,035 B2 * | 12/2008 | Lee ......................... | H01R 12/592 439/121 |
| 7,786,546 B2 | 8/2010 | Hsu | |
| 7,971,350 B2 | 7/2011 | Joshi | |
| 2009/0306485 A1 | 12/2009 | Bell | |
| 2013/0175080 A1 | 7/2013 | Colahan | |

\* cited by examiner

ELECTROMAGNETIC INTERFERENCE SHIELDING AND STRAIN RELIEF STRUCTURES FOR COUPLED PRINTED CIRCUITS

BACKGROUND

This relates generally to electronic devices and, more particularly, to electronic devices with electromagnetic interference shielding and strain relief structures.

Electronic devices include electrical components. Components are mounted on substrates such flexible printed circuits and rigid printed circuit boards. Interconnect lines formed from patterned metal traces carry signals within the substrates. For example, metal traces may carry signals between integrated circuits on a printed circuit.

Substrates such as printed circuits are often coupled together using connectors such as board-to-board connectors and using connections formed from conductive material such as anisotropic conductive film or solder. If care is not taken, electromagnetic interference may be emitted from the signal lines on printed circuits and other substrates, particularly in the vicinity of electrical connection structures formed from printed circuit connectors or connections formed from anisotropic conductive film and or solder. If not properly secured, electrical connection structures may also be susceptible to damage.

It would therefore be desirable to be able to provide improved arrangements for shielding and securing connections between substrates in electronic devices.

SUMMARY

Electrical components in an electronic device are mounted on substrates such as printed circuits. The printed circuits may include rigid printed circuit boards and flexible printed circuits. The printed circuits contain signal paths formed from metal traces.

The signal paths of the printed circuits are coupled together using electrical connection structures such as printed circuit board-to-board connectors, contacts joined by anisotropic conductive film, or contacts joined using solder. Strain relief and electromagnetic interference shielding structures may be provided that electromagnetically shield the electrical connection structures and help prevent the electrical connection structures from being damaged during movement of the printed circuits.

Electrical connection structures may be surrounded by conductive resilient ring-shaped structures such as conductive foam structures. The conductive foam structures may be provided with a metal layer with which the conductive foam structures are soldered to a ring of metal on a printed circuit or may be implemented using springs. The conductive resilient ring-shaped structures form electromagnetic interference shielding structures that electromagnetically shield electrical connection structures.

Strain relief structures may be formed from an elastomeric ring that is interposed between the printed circuits and that surrounds the electrical connection structures. The elastomeric ring may be bonded to the printed circuits as a result of heat and pressure applied to the elastomeric ring while heating and pressing the printed circuits to form anisotropic conductive film joints or solder joints between the contacts on the printed circuits. Strain relief structures may also be formed by overmolding a plastic structure such as an elastomeric plastic structure. The printed circuits may be embedded within the overmolded plastic structure.

To provide strain relief structures with electromagnetic interference shielding capabilities, the strain relief structures may be formed from conductive plastic or may be coated with conductive plastic or metal layers.

Further features, their nature and various advantages will be more apparent from the accompanying drawings and the following detailed description of the preferred embodiments.

DETAILED DESCRIPTION

Figure 1:
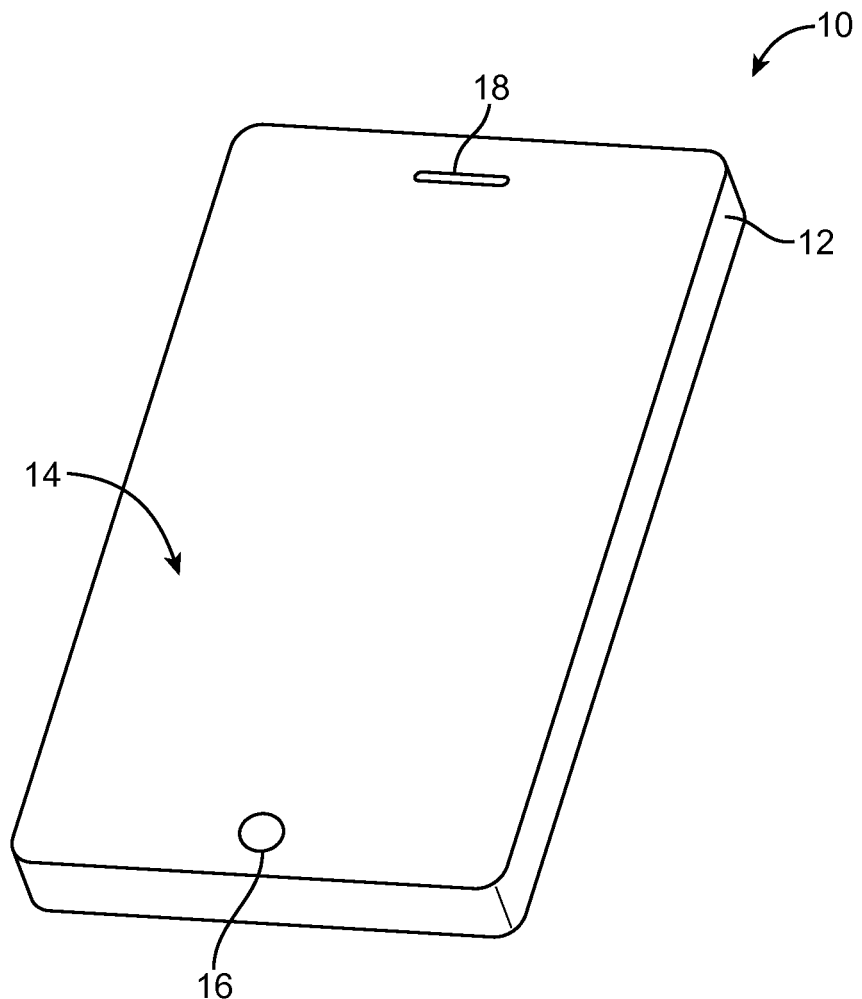
FIG. 1 is a perspective view of an illustrative electronic device of the type that may be provided with shielding and strain relief structures in accordance with an embodiment.

An illustrative electronic device that may be provided with strain relief structures and electromagnetic interference shielding structures for electromagnetically shielding electrical connection structures between printed circuits is shown in FIG. 1. Electronic devices such as device 10 of FIG. 1 may be cellular telephones, media players, other handheld portable devices, somewhat smaller portable devices such as wrist-watch devices, pendant devices, or other wearable or miniature devices, gaming equipment, tablet computers, notebook computers, desktop computers, televisions, computer monitors, computers integrated into computer displays, or other electronic equipment.

In the example of FIG. 1, device 10 includes a display such as display 14. Display 14 has been mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18.

Housing 12 may have one or more openings to accommodate structures such as buttons, status indicators, and connector ports. Housing 12 may, for example, connector ports such as connector port 20 in housing 12. Connectors for connector ports such as connector port 20 may include audio jack connectors, power connectors, digital data port connectors (e.g., for forming a digital data port that receives digital data on digital signal lines and that receives power on power lines), a port that handles a mixture of analog signals, digital signals, and power signals, or other suitable connectors.

The components in device 10 may include radio-frequency transceiver circuitry for transmitting and receiving wireless signals using antenna structures in device 10, clock circuits, display driver circuits, processors, memory, and other electrical components. These components may transmit and receive signals such as radio-frequency signals.

Radio-frequency signals and other signals in device 10 may be conveyed using signal paths. Device 10 may include printed circuit signal paths formed from metal traces on a flexible printed circuit formed from a layer of polyimide or other flexible polymer layer or printed circuit paths formed from metal trace on rigid printed circuit boards (e.g., printed circuits formed from fiberglass-filled epoxy or other rigid printed circuit board material). For example, device 10 may include signal paths such as coaxial cables, twisted pairs of wires, flexible printed circuit cables, rigid printed circuit boards with signal lines, plastic carriers with metal traces, dielectric substrates such as ceramic and glass substrates with signal lines, and other types of signal paths.

In some situations, electrical connections are formed between pairs of these signal paths. For example, signal paths on a first printed circuit such as a flexible or rigid printed circuit may be coupled to signal paths on a second flexible or rigid printed circuit. The first and second printed circuits may be coupled using electrical connection structures such as a board-to-board connector or other connector structures. Conductive adhesives such as anisotropic conductive film or solder joints formed from solder paste that has been heated may also be used in forming electrical connection structures for coupling signal paths on pair of printed circuits.

Electrical connection structures that electrically couple signal paths in a pair of printed circuits such as connections formed using printed circuit connectors and conductive adhesive connections or solder connections may be more likely to emit radio-frequency electromagnetic interference signals than signal paths that are embedded within the dielectric layers on printed circuits. Printed circuit connection structures may also be susceptible to decoupling during assembly of the components of device 10 and during use of device 10.

To reduce electromagnetic interference effects within device 10, printed circuit connections (or electrical connection structures that couple other types of signal paths) are preferably provided electromagnetic interference shielding. Strain relief structures are also provided that support the electrical connection structures that are formed between printed circuits in device 10.

Figure 2:
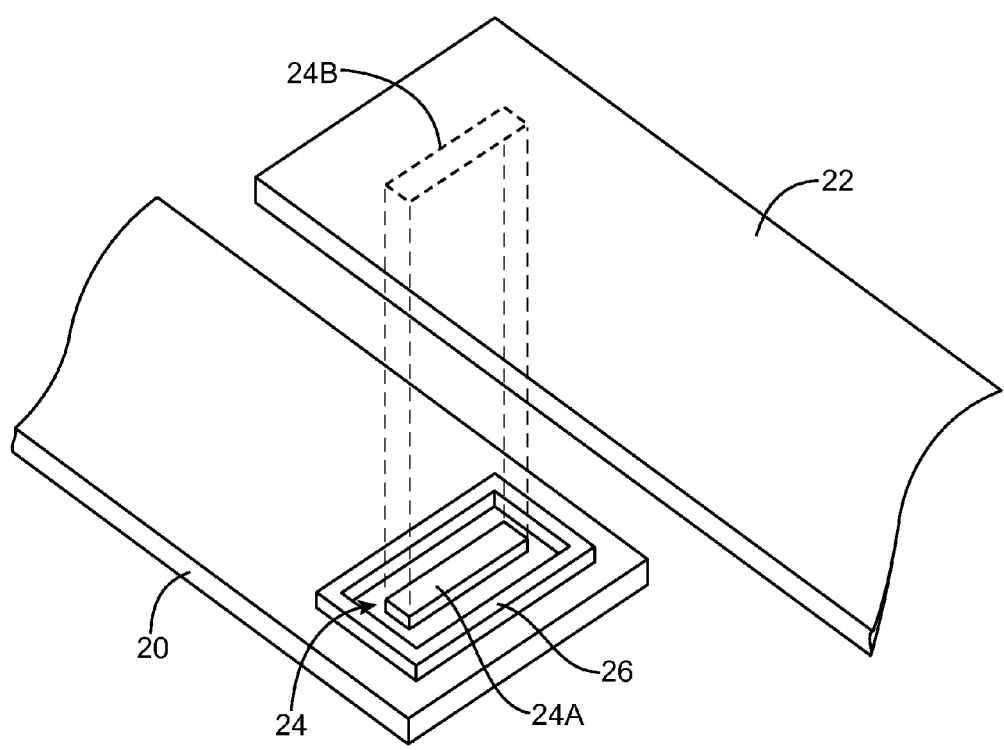
FIG. 2 is an exploded perspective view of a pair of printed circuit substrates being joined using printed circuit board-to-board connectors and an associated ring-shaped shielding structure of the type that may be used to provide the board-to-board connector with electromagnetic shielding in accordance with an embodiment.

FIG. 2 is an exploded perspective view of a pair of illustrative signal path structures. Configurations such as the configuration of FIG. 2 in which signal path structures are formed using flexible printed circuits and/or rigid printed circuits are sometimes described herein as an example. In general, however, signal path structures may include any suitable signals paths such as wires, cables, conductive lines on plastic carriers, ceramic, or glass, etc.

As shown in FIG. 2, printed circuit 20 (e.g., a flexible printed circuit or a rigid printed circuit) and printed circuit 22 (e.g., a flexible printed circuit or a rigid printed circuit) are coupled using connector 24. Connector 24 may be, for example, a printed circuit board-to-board connector having a first portion such as connector 24A that is mounted on printed circuit 20 and a mating second portion such as connector 24B that is mounted on printed circuit 22. Connections may also be formed between printed circuit 22 and 24 using conductive adhesive, solder, or other connection structures. The use of a board-to-board connector to form connector 24 is merely illustrative.

One or more structures such as ring-shaped structures 26 may be used to provide electromagnetic interference shielding and structural support to the connection between printed circuits 20 and 22 that is being formed using connector 24. Structures 26 may be conductive structures that have a rectangular ring shape (as shown in FIG. 2) or may be conductive structures with another shape that surrounds or partly surrounds connector 24. Conductive structures 26 may extend in a loop around the periphery of connector 24, thereby electromagnetically sealing and shielding the periphery of connector 24. Metal structures such as ground traces in printed circuits 20 and 22 may also be used in providing shielding. For example, ground plane traces may be formed in printed circuits 20 and 22 using patterns that overlap connector 24. By including structures such as ring-shaped structures that surround the periphery of connector 24 in lateral dimensions X and Y, electromagnetic signals that might otherwise be emitted laterally from the connector are blocked.

Figure 3:
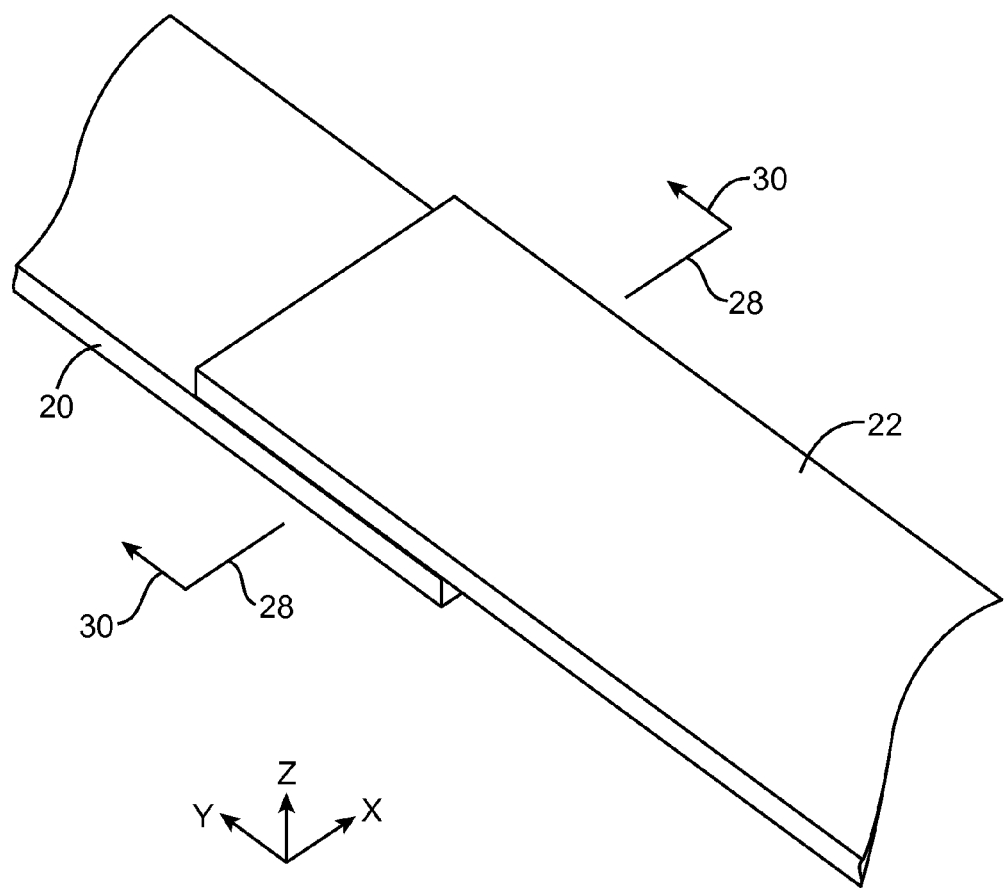
FIG. 3 is a perspective view of the pair of printed circuit substrates of FIG. 2 following joining of the substrates using the board-to-board connector in accordance with an embodiment.
Figure 4:
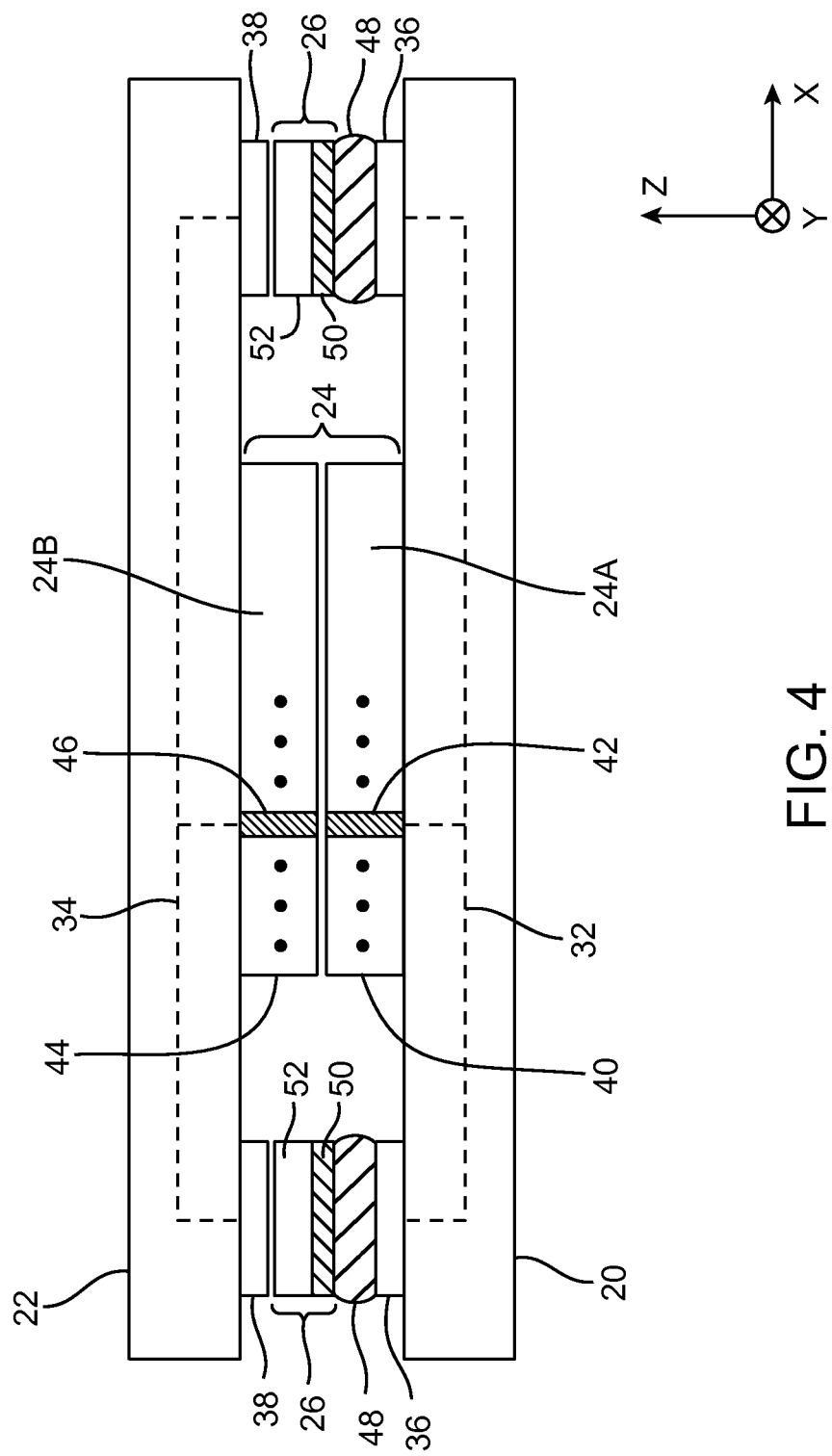
FIG. 4 is a cross-sectional side view of the board-to-board connector and pair of printed circuit substrates of FIGS. 2 and 3 showing how the ring-shaped shielding structure may be used to provide electromagnetic signal interference shielding for the board-to-board connector in accordance with an embodiment.

FIG. 3 is a perspective view of printed circuits 20 and 22 after printed circuits 20 and 22 have been connected using connector 26. A cross-sectional side view of printed circuits 20 and 22 taken along line 28 and viewed in direction 30 is shown in FIG. 4. As shown in FIG. 4, printed circuits 20 and 22 contain conductive signal lines. Metal traces may be used in forming signal lines 32 and metal contacts 36 on printed circuit 20. Metal traces may also be used in forming signal lines 34 and metal contacts 38 on printed circuit 22. Metal traces in printed circuits 20 and 22 may be coupled to ground signal paths, data lines, and other signal paths. For example, ground paths may be coupled to connectors 36 and 38.

In the configuration of FIG. 4, connector 24 is a board-to-board connector having upper connector 24B mounted on printed circuit 22 and mating lower connector 24A mounted on printed circuit 20. Lower connector 24A has lower connector plastic body 40 and contact pins 42. Contact pins 42 are connected to signal lines formed form metal traces 32. Upper connector 24B has upper connector plastic body 44 and contact pins 46. Contact pins 46 are connected to signal lines formed from metal traces 34. When upper connector 24B and lower connector 24A are coupled as shown in FIG. 4, contacts such as pins 42 in connector 24A mate with corresponding contacts such as pins 46 in connector 24B, thereby interconnecting the signal paths formed from traces 32 on printed circuit 20 and the signal paths formed from traces 34 on printed circuit 22.

Connector 24 may have a rectangular shape with four edges. Shielding structures 26 preferably have a rectangular ring shape with four corresponding edges that run parallel to the edges of connector 24 and surround connector 24 in lateral dimensions X and Y. Shielding structures 26 of FIG. 4 are soldered to contacts 36 (e.g., a rectangular ring-shaped trace) on printed circuit 20 using solder 48. Resilient structures such as foam 52 or other resilient material may be included in conductive structures 26 to allow conductive structures 26 to form resilient ring-shaped shielding structures that can be compressed between printed circuits 20 and 22. A conductive layer such as conductive layer 50 may be provided on the lower surface of foam 52.

Foam 52 may be a conductive foam formed from an elastomeric material with conductive filler (e.g., a filler that is formed from metal particles or other conductive particles). Conductive layer 50 may be a layer of metal (e.g., one or more elemental metals and/or alloys). With this type of configuration, solder 48 may be used in soldering contacts 36 to metal layer 50 in structures 26. When conductive structures 26 are compressed between printed circuits 20 and 22 as shown in FIG. 4, contacts 36 are shorted to solder 48, metal layer 50, conductive foam 52, and contacts 38. Contacts 38 may be formed from a rectangular ring-shaped metal trace on printed circuit 22 (as an example). Ground traces in metal traces 32 may be coupled to contacts 36. Ground traces in metal traces 34 may be shorted to ring-shaped contact pad structure 38.

Figure 5:
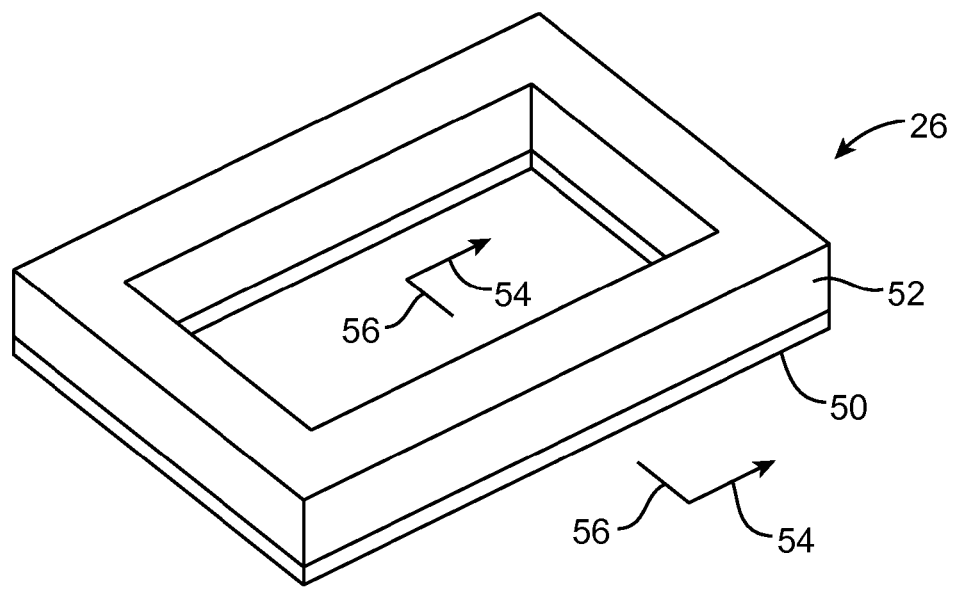
FIG. 5 is a perspective view of an illustrative ring-shaped shielding structure for surrounding a connection between printed circuits such as a board-to-board connector in accordance with an embodiment.

FIG. 5 is a perspective view of shielding structure 26 in an illustrative configuration in which shielding structure 26 has a ring shape. Shielding structure 26 includes resilient (foam) ring 52 and metal ring 50 (e.g., a rectangular ring-shaped metal layer). A cross-sectional side view of elastomeric shielding ring 26 of FIG. 5 taken along line 56 and viewed in direction 54 is shown in FIG. 6.

Figure 6:
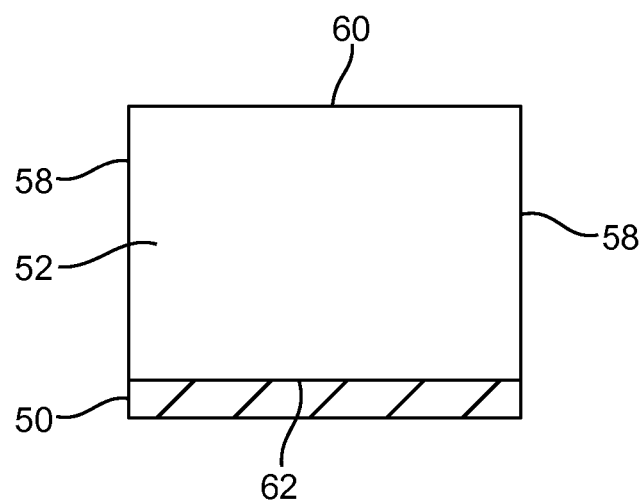
FIG. 6 is a cross-sectional side view of a portion of the ring-shaped shielding structure of FIG. 5 in a configuration in which the shielding structure has a lower metal layer in accordance with an embodiment.

As shown in FIG. 6, metal layer 50 may be formed on lower surface 62 of foam 52 while leaving the outer peripheral surface and opposing inner peripheral surface of foam 52 (i.e., peripheral side surface 58) and upper surface 60 of foam 52 uncoated and free of metal.

Figure 7:
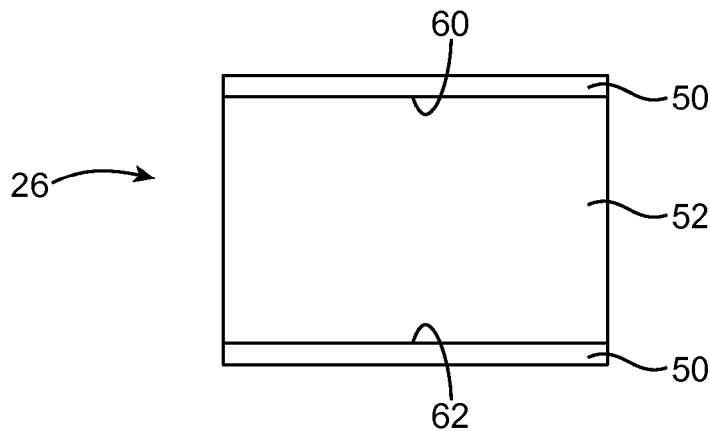
FIG. 7 is a cross-sectional side view of a portion of a ring-shaped shielding structure of the type shown in FIG. 5 in a configuration in which the shielding structure has opposing upper and lower metal layers in accordance with an embodiment.

FIG. 7 is a cross-sectional side view of shielding structures 26 in an illustrative configuration in which foam 52 has been covered with an upper metal layer 50 on upper foam surface 60 and an opposing lower metal layer 50 on opposing lower foam surface 62.

Figure 8:
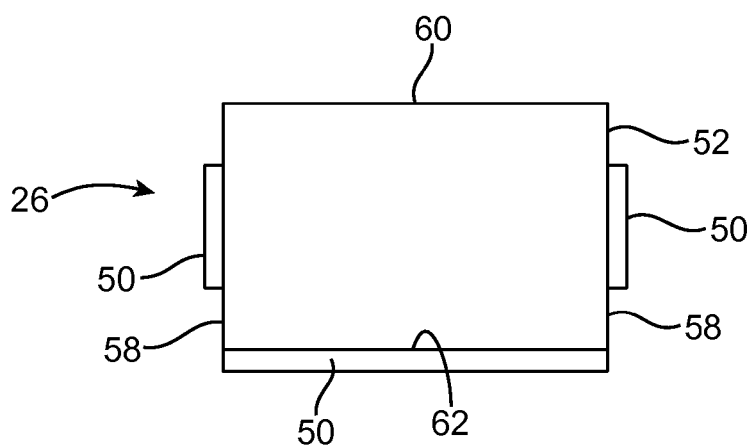
FIG. 8 is a cross-sectional side view of a portion of a ring-shaped shielding structure of the type shown in FIG. 5 in a configuration in which the shielding structure has a lower metal layer and opposing inner and outer metal layers in accordance with an embodiment.

FIG. 8 is a cross-sectional side view of shielding structures 26 in an illustrative configuration in which metal 50 has been formed on the inner and outer sidewalls 58 of foam 52. If desired, metal 50 may be formed on only the inner sidewall of foam 52 or only the outer sidewall of foam 52. Solid coatings of metal or patterned metal 50 may be used. In the example of FIG. 8, sidewall metal structures 50 cover only part of the sidewalls 58 of foam 52. This is merely illustrative. Metal sidewall layers 50 may cover some of each sidewall 58 or may cover all of each sidewall 58. Configurations in which only part of sidewalls 58 are covered may help ensure that foam 52 is able to be compressed (i.e., partial metal coverage may help ensure that shielding structures 26 remain resilient).

Figure 9:
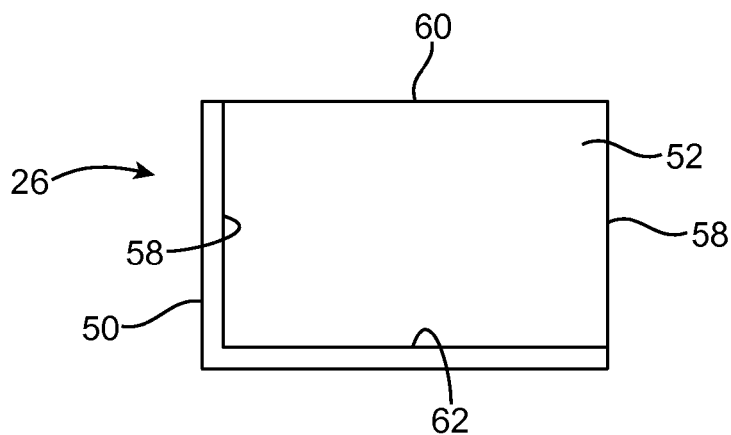
FIG. 9 is a cross-sectional side view of a portion of a ring-shaped shielding structure of the type shown in FIG. 5 in a configuration in which the shielding structure has an L-shaped metal layer coating the outer periphery of the ring-shaped shielding structure and the lower surface of the ring-shaped shielding structure in accordance with an embodiment.
Figure 10:
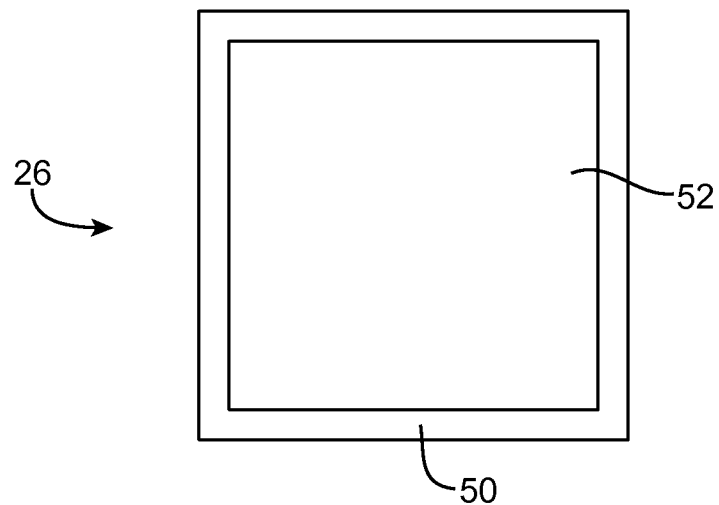
FIG. 10 is a cross-sectional side view of a portion of a ring-shaped shielding structure of the type shown in FIG. 5 in a configuration in which the shielding structure has a metal layer that encloses the ring-shaped shielding structure in accordance with an embodiment.

FIG. 9 is a cross-sectional side view of shielding structures 26 in an illustrative configuration in which metal 50 has an L-shaped cross-section that covers lower foam surface 62 and an outer or inner sidewall surface 58. U-shaped configurations for metal 50 may also be used (e.g., any three of the four surfaces of foam 52 may be covered with metal 50). As shown in the cross-sectional side view of shielding structures 26 of FIG. 10, metal 50 may cover all four surfaces (upper, lower, and side) of foam 52.

Figure 11:
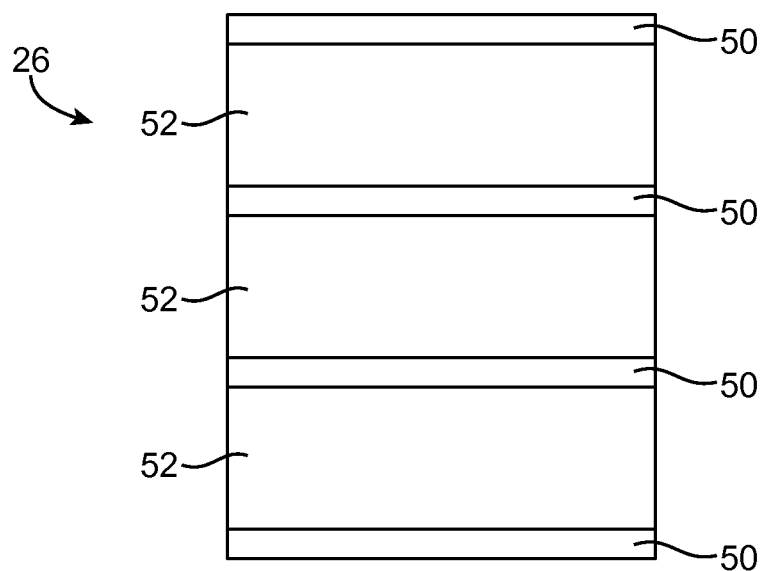
FIG. 11 is a cross-sectional side view of a portion of a ring-shaped shielding structure of the type shown in FIG. 5 in a configuration in which the shielding structure has multiple parallel layers of metal interposed between respective layers of foam in accordance with an embodiment.

FIG. 11 is a cross-sectional side view of shielding structures 26 in an illustrative configuration in which layers of metal 50 are interleaved with foam layers 52. Interposing layers of metal 50 within foam 52 provides foam 52 with additional conductivity and shielding capabilities while ensuring that structures 26 remain sufficiently resilient to be compressed between printed circuits 20 and 22 when connectors 24A and 24B are coupled. If desired, metal layers 50 may run vertically or diagonally.

Figure 12:
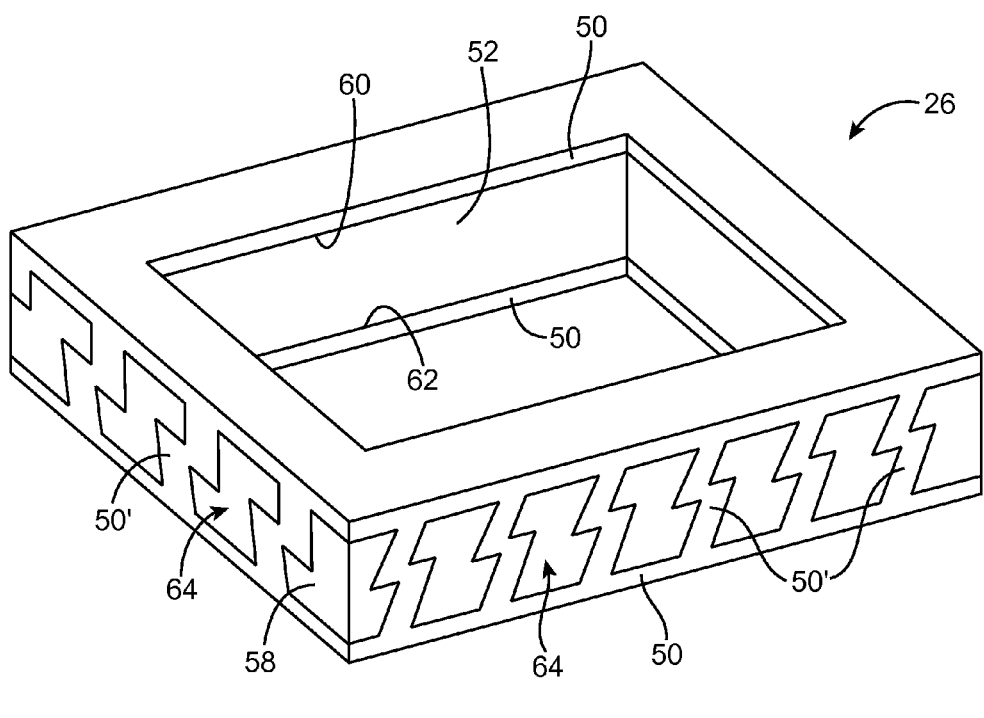
FIG. 12 is a perspective view of a portion of a ring-shaped shielding structure of the type shown in FIG. 5 in a configuration in which the shielding structure has an outer wall surface covered with patterned metal structures formed from angled strips of metal separated by angled openings in accordance with an embodiment.
Figure 13:
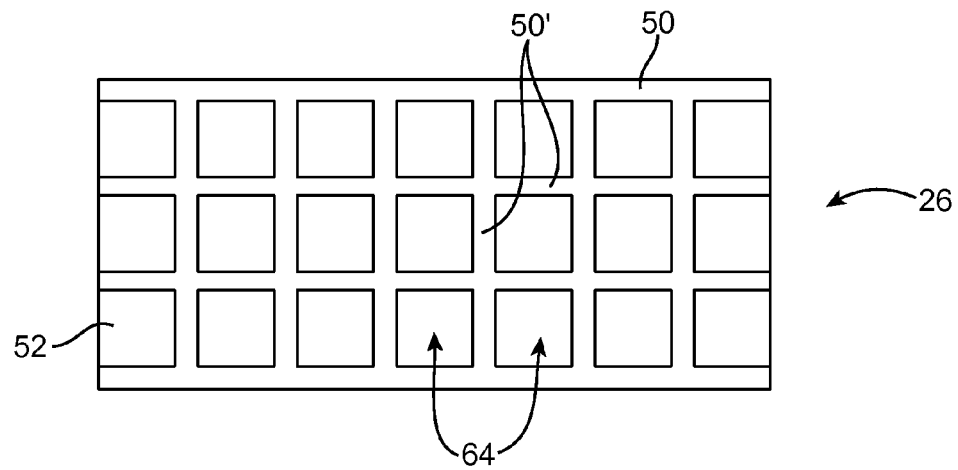
FIG. 13 is a side view of a portion of a ring-shaped shielding structure of the type shown in FIG. 5 in a configuration in which the shielding structure has an outer wall surface covered with patterned metal structures forming a rectangular grid of metal lines with interspersed rectangular openings in accordance with an embodiment.
Figure 14:
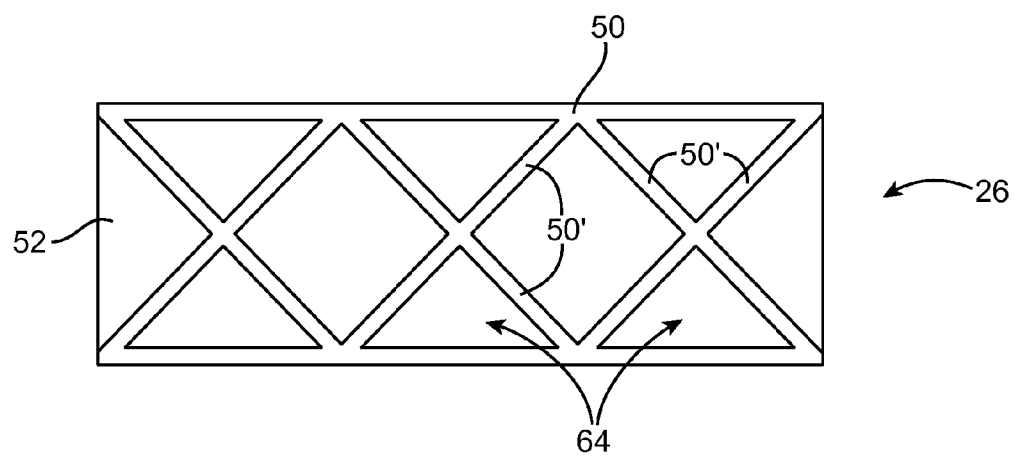
FIG. 14 is a side view of a portion of a ring-shaped shielding structure of the type shown in FIG. 5 in a configuration in which the shielding structure has an outer wall surface covered with patterned metal structures forming a grid of diagonal metal lines separated by triangular and diamond-shaped openings in accordance with an embodiment.

FIG. 12 is a perspective view of shielding structures 26 in an illustrative configuration in which outer sidewall 58 of foam 52 has been covered with patterned portions 50' of metal layer 50. Metal layer 50 may also cover upper foam surface 60 and lower foam surface 62. Patterned metal structures 50' may have openings such as openings 64 and shapes that allow foam 52 to be compressed in dimension Z. In the arrangement of FIG. 12, metal structures 50' form meandering (e.g., zigzagging) lines. Other types of patterned metal structures 50' may be used if desired. For example, metal portions 50' may have a rectangular grid pattern with intersecting horizontal and vertical metal lines that form a metal mesh with rectangular openings 64 as shown in FIG. 13 or may have a crisscrossed metal line pattern with diagonal metal lines and triangular and diamond shaped openings 64 as shown in FIG. 14.

Figure 15:
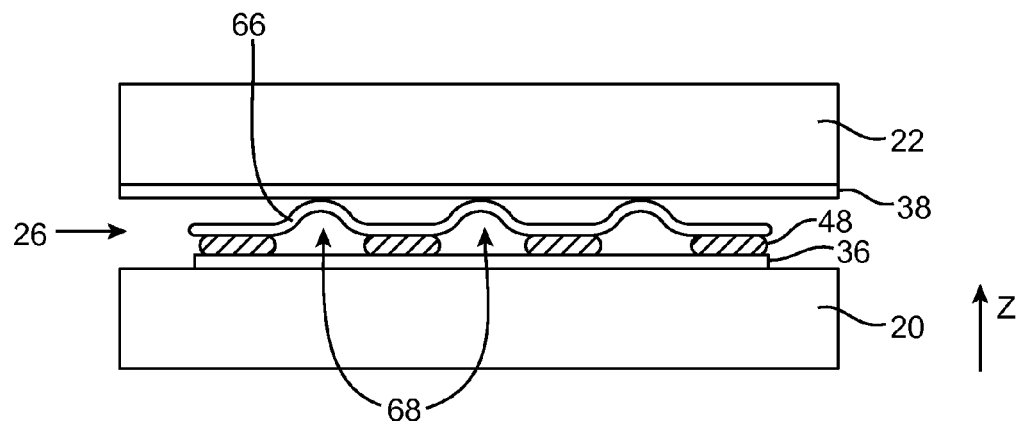
FIG. 15 is a cross-sectional side view of a portion of a shielding structure in a configuration in which the shielding structure has a ring-shaped metal spring soldered to a substrate in accordance with an embodiment.

If desired, resilient conductive shielding structures 26 may be formed from flexible metal structures such as spring structures. As shown in the cross-sectional side view of illustrative shielding structures 26 of FIG. 15, for example, shielding structures 26 may include a metal spring such a spring 66 that has bends 68. Bends 68 may allow shielding structures 26 to flex in dimension Z. If desired, conductive foam, a thin metal sheet, conductive fabric, or other conductive material may be used to provide structures 26 with additional shielding capabilities. Solder 48 can be used to attach spring 66 to contacts 36 on printed circuit 20. Contacts 36 may have a rectangular ring shape. Spring 66 may have a rectangular ring shape or multiple spring segments 66 may be used in forming spring-based shielding structures 26 of FIG. 15.

Figure 16:
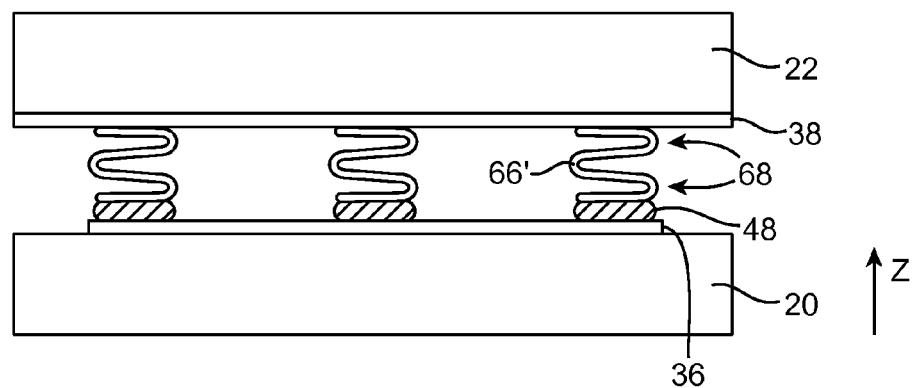
FIG. 16 is a cross-sectional side view of a portion of a shielding structure in a configuration in which the shielding structure has a series of metal springs soldered to a substrate in a ring surrounding a board-to-board connector or other connection in accordance with an embodiment.

In the example of FIG. 16, a series of metal springs 66' has been used to form shielding structures 26. Each spring 66' in FIG. 16 has one or more bends 68 to allow springs 66' to be compressed when shielding structures 26 are compressed between printed circuits 20 and 22. Springs 66' may be electrically connected to each other by using solder 48 to solder springs 66' to rectangular ring-shaped contact 36 on printed circuit 20.

Figure 17:
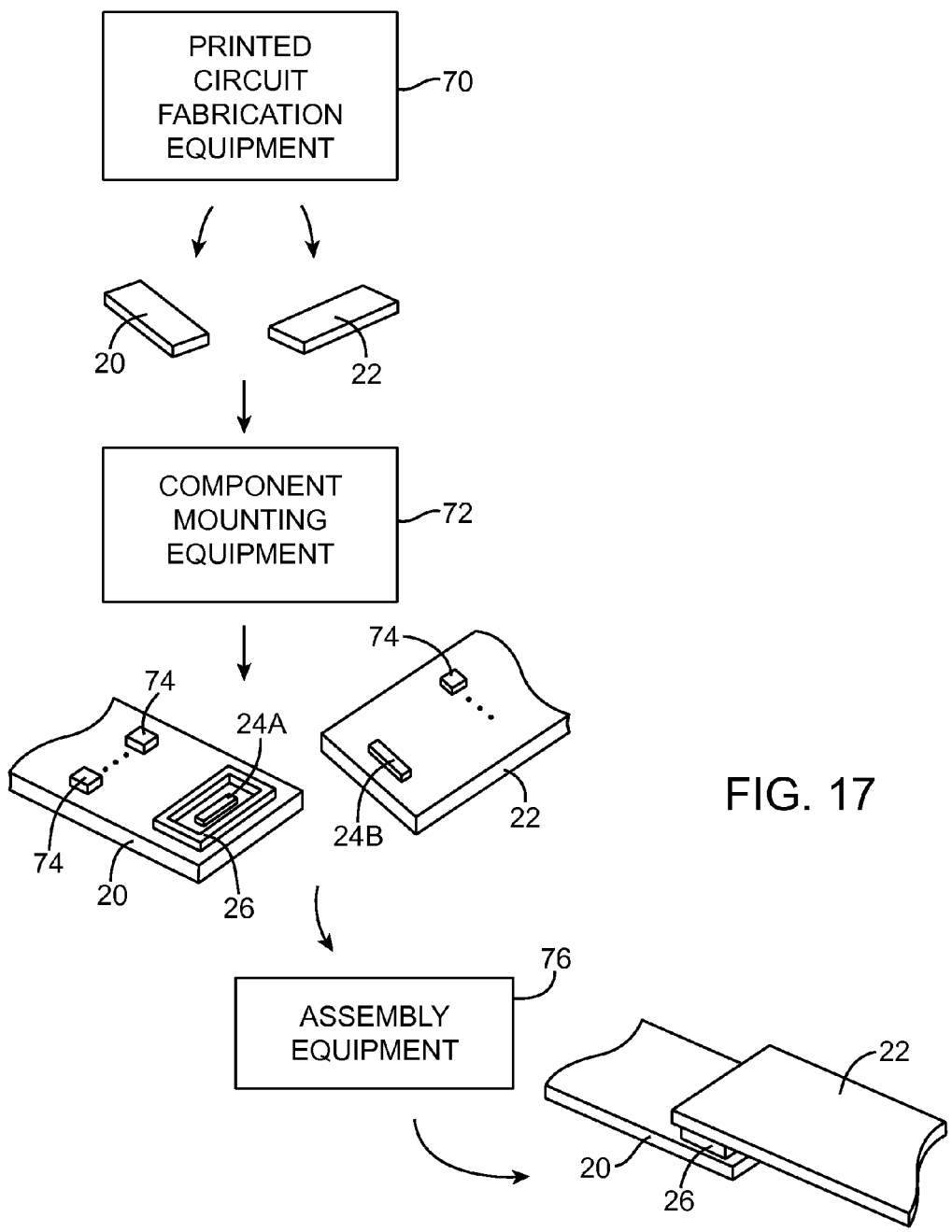
FIG. 17 is a diagram of equipment and operations involved in forming shielded electrical connections between substrates such as printed circuit substrates in accordance with an embodiment.

FIG. 17 is a diagram of equipment and operations involved in forming shielded connections between substrates such as printed circuits 20 and 22. As shown in FIG. 17, printed circuits 20 and 22 may be formed using printed circuit fabrication equipment 70. Equipment 70 may include tools for depositing and patterning metal traces such as traces 36 and 38. Metal traces 36 and 38 may, for example, be formed in rectangular ring shapes that are configured to mate with a resilient rectangular ring-shaped shielding structure.

Component mounting equipment 72 may include pick-and-place equipment and/or equipment such as a solder reflow oven for mounting electrical components 74, connectors 24A and 24B, and shielding structures 26 on printed circuits 20 and 22.

Assembly equipment 76 may include computer-controlled positioners and/or manually controlled equipment for attaching board-to-board connectors 24A and 24B to form board-to-board connector 24, thereby electrically and mechanically coupling printed circuits 20 and 22. When coupling connectors 24A and 24B in this way, resilient ring-shaped shielding structures 26 are compressed between printed circuits 20 and 22 and form an electromagnetic interference shield that lies between printed circuits 20 and 22 and that surrounds the periphery of connector 24.

Figure 18:
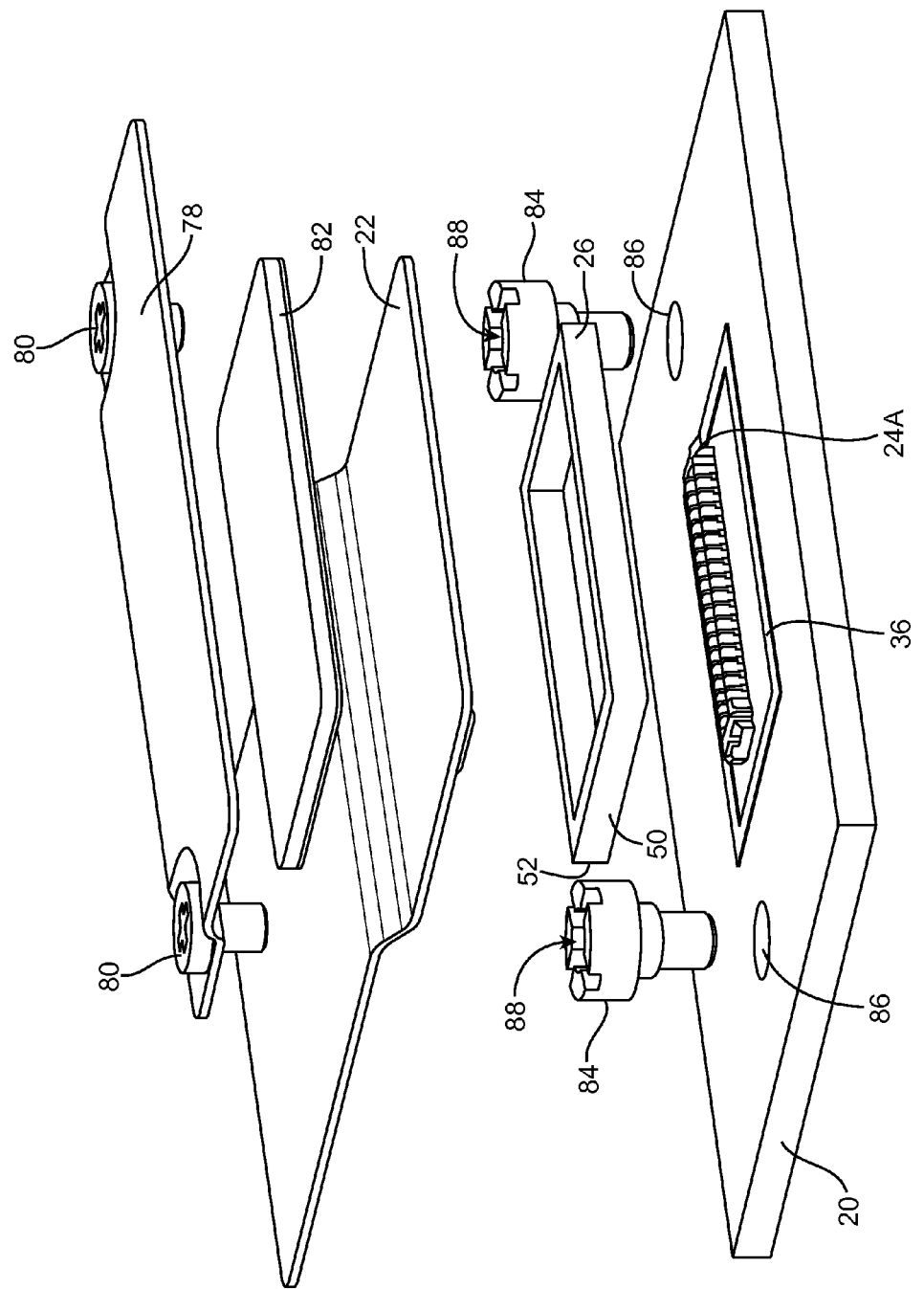
FIG. 18 is an exploded perspective view of structures used for forming an electromagnetically shielded connection between printed circuits in accordance with an embodiment.

FIG. 18 is an exploded perspective view of structures used for forming an electromagnetically shielded connection between printed circuits 20 and 22 in an illustrative configuration in which mounting structures such as metal bracket 78 are used in securing printed circuit 22 to printed circuit 20. In the illustrative configuration of FIG. 18, printed circuit 20 is a rigid printed circuit having openings 86 that are configured to receive standoffs 84. Metal trace 36 forms a rectangular ring that is soldered or otherwise electrically connected to mating rectangular metal layer 50 on the lower surface of rectangular elastomeric conductive foam 52 in resilient shielding structures 26.

Figure 19:
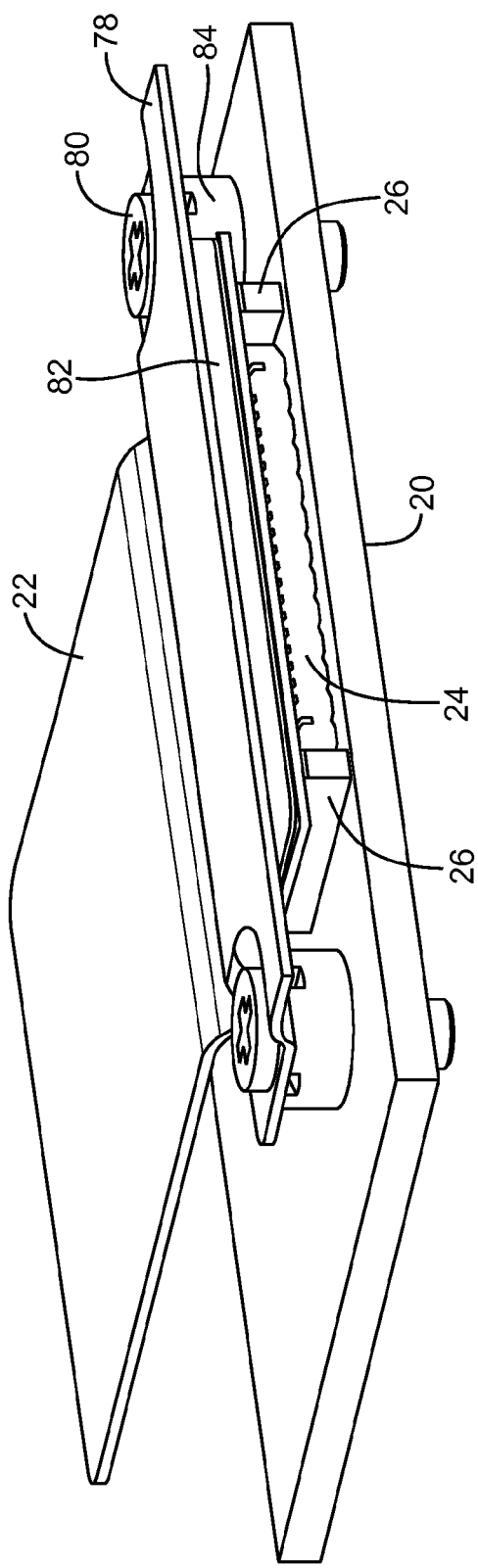
FIG. 19 is a perspective view of the structures of FIG. 18 following assembly of the printed circuits in accordance with an embodiment.

Printed circuit 22 is a flexible printed circuit having a connector that mates with lower board-to-board connector 24A. Stiffening structures 82 may include a layer of stiff material such as a layer of sheet metal (e.g., a stainless steel layer) and/or a resilient layer of material such as a layer of foam. Stiffening structures 82 may be attached to flexible printed circuit 22 using a layer of adhesive. Bracket 78, which may sometimes be referred to as a cowling, may be formed from a sheet metal layer (e.g., a stamped stainless steel structure). Openings in bracket 78 allow screws 80 to pass through bracket 78. Screws 80 have threaded shafts that screw into threaded openings 88 in standoffs 84 to secure bracket 78, stiffener 82, printed circuit 22, and shielding structures 26 to printed circuit 20. FIG. 19 is a cross-sectional perspective view of the structures of FIG. 18 following assembly to couple printed circuits 20 and 22.

Figure 20:
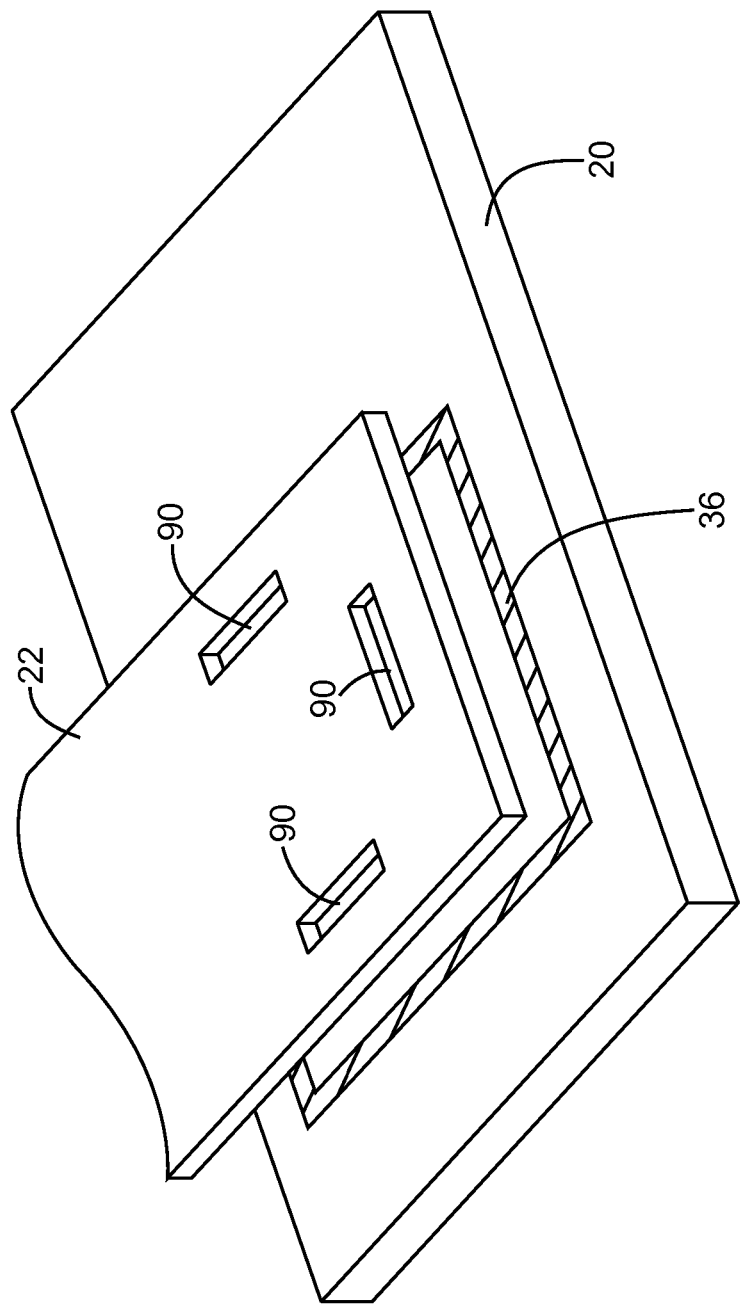
FIG. 20 is an exploded perspective view of a printed circuit substrate and a flexible printed circuit substrate with slots to accommodate a bracket used in attaching the flexible printed circuit substrate to the printed circuit substrate in accordance with an embodiment.
Figure 21:
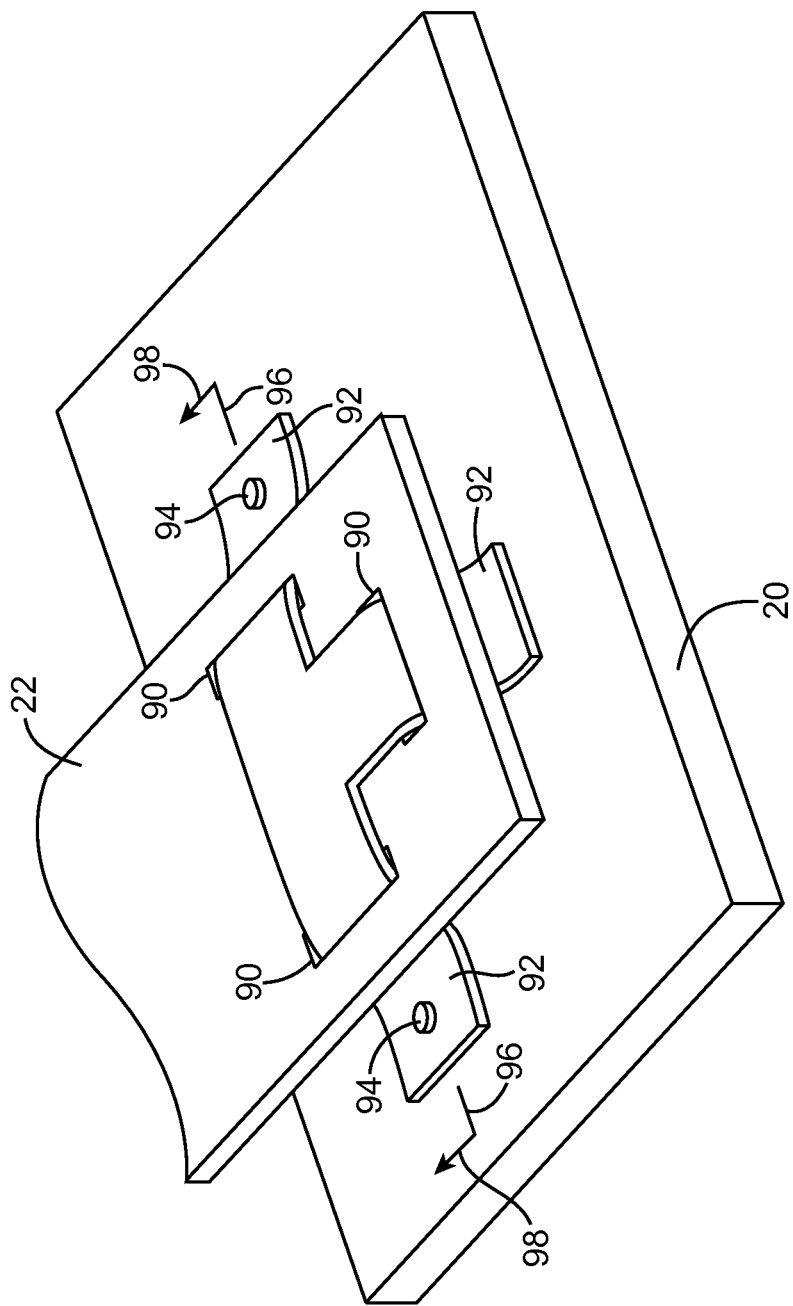
FIG. 21 is a perspective view of the structures of FIG. 20 in which the substrates have been joined using a bracket in accordance with an embodiment.

FIG. 20 is an exploded perspective view of a printed circuits such as printed circuits 20 and 22 in a configuration in which printed circuit 22 has been provided with slots 90 to accommodate a mounting structure such as a metal bracket. As shown in FIG. 21, for example, metal bracket 92 may have arms that extend through slot-shaped openings 90 to hold printed circuit 22 (e.g., a flexible printed circuit) to printed circuit 20 (e.g., a rigid printed circuit). Screws 94 may be screwed into threaded standoffs that are press-fit into openings in printed circuit 20 or may be screwed into threaded bosses in housing 12 below printed circuit 20 (as examples). When screwed down in this way, bracket 92 helps hold printed circuit 22 to printed circuit 20, thereby securing board-to-board connector 24 between printed circuits 20 and 22. Metal bracket 92 may also provide electromagnetic interference shielding.

Figure 22:
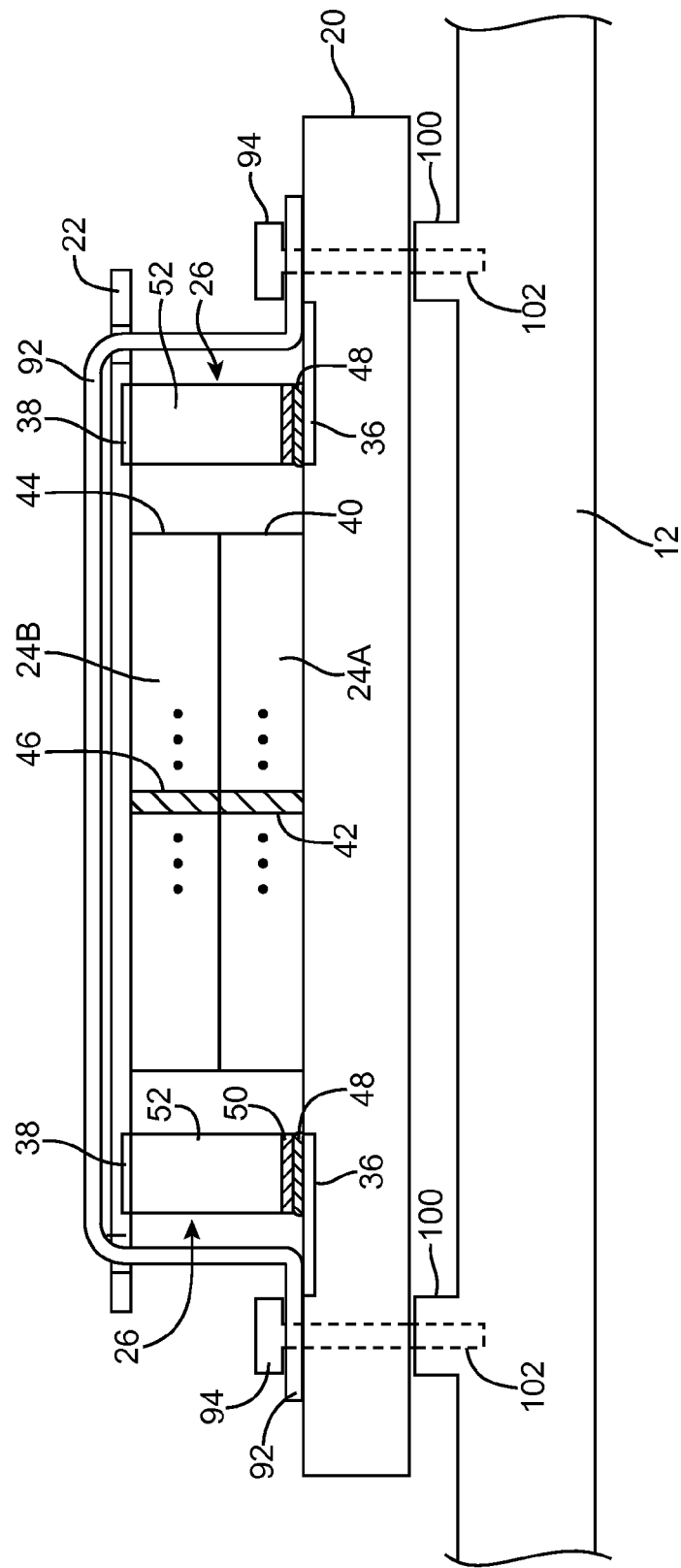
FIG. 22 is a cross-sectional side view of the structures of FIG. 21 in accordance with an embodiment.

A cross-sectional side view of the structures of FIG. 21 taken along line 96 and viewed in direction 98 is shown in FIG. 22. In the configuration of FIG. 22, housing 12 has screw boss protrusions 100 that have threaded openings for receiving threaded shafts 102 of screws 94 when screws 94 are used to mount bracket 92 to printed circuit 20 and housing 12.

Bracket 92 may, if desired, be shorted to contact pads 36 (e.g., a grounded rectangular ring formed form metal traces on printed circuit 20). Optional shielding structures 26 may be soldered to portions of contacts 36. Shielding structures 26 may include conductive foam 52 and metal layer 50. Metal layer 50 and conductive foam 52 may have rectangular ring shapes that match the rectangular ring shape of contact structures 36. Corresponding rectangular ring-shaped metal trace contact structures 38 on printed circuit 22 may contact the upper surface of conductive foam ring 52.

It may be desirable to couple substrates such as printed circuits 20 and 22 using electrical connections formed from conductive adhesive (anisotropic conductive film). Operations involved in forming a connection with type of arrangement are shown in FIGS. 23, 24, 25, and 26.

Figure 23:
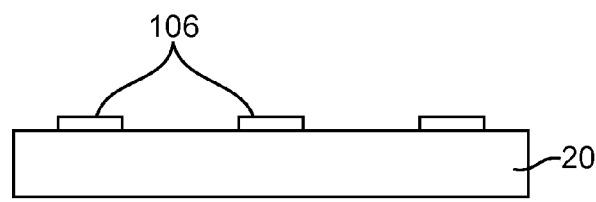
FIG. 23 is a cross-sectional side view of a printed circuit with contacts in accordance with an embodiment.

FIG. 23 is a cross-sectional side view of a printed circuit (printed circuit 20) with contacts 106 that have been formed on the surface of the printed circuit substrate. Contacts 106 are formed from patterned metal traces that are coupled to signal line traces in the printed circuit substrate (e.g., traces 32 of FIG. 4).

Figure 24:
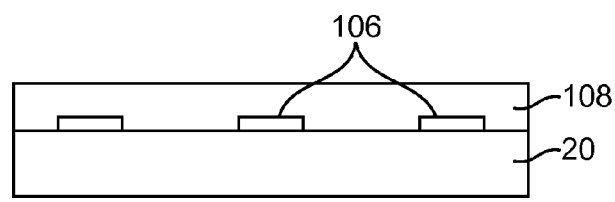
FIG. 24 is a cross-sectional side view of the printed circuit of FIG. 23 in which a layer of anisotropic conductive film has been placed on top of the contacts in accordance with an embodiment.

As shown in FIG. 24, after forming printed circuit 20 with contacts 106, a layer of conductive adhesive such as anisotropic conductive film 108 may be formed on the surface of printed circuit 20 over contacts 106. For example, electrical connection structures based on anisotropic conductive film that couples printed circuit contacts that are formed from metal traces may be formed using lamination equipment or other suitable equipment for attaching anisotropic conductive film.

Figure 25:
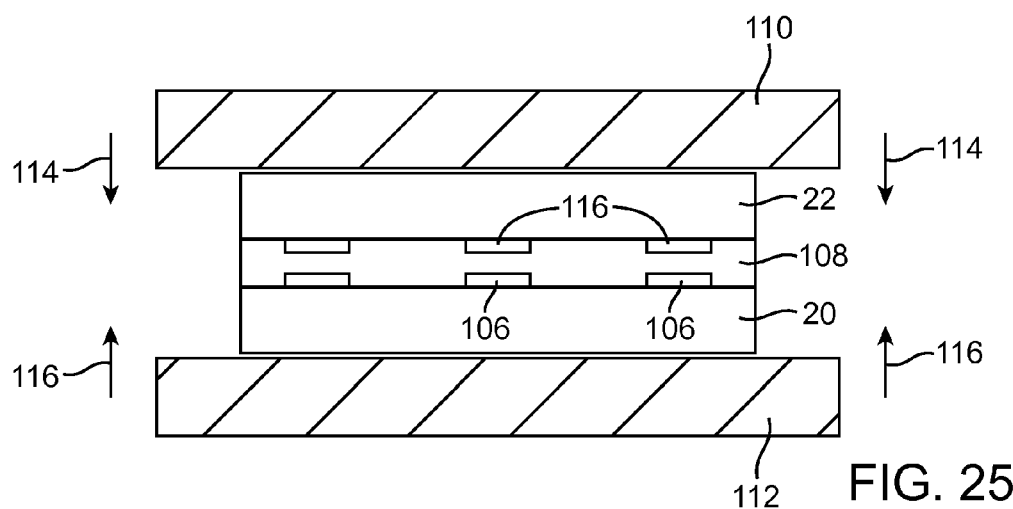
FIG. 25 is a cross-sectional side view of the printed circuit of FIG. 24 being coupled to another printed circuit by heating and pressing the printed circuits together in accordance with an embodiment.
Figure 26:
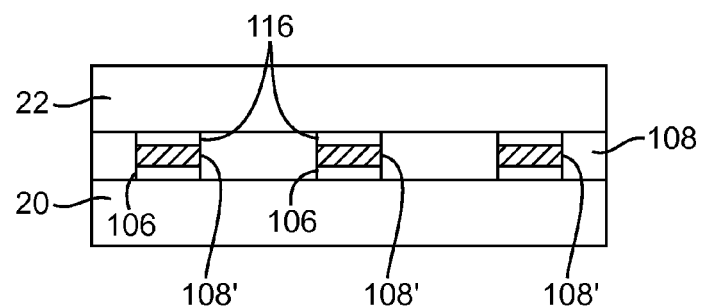
FIG. 26 is a cross-sectional side view of the printed circuits of FIG. 25 after connections have been formed using the anisotropic conductive film in accordance with an embodiment.

As shown in FIG. 25, printed circuit 22 with contacts 116 may be placed on printed circuit 20, so that contacts 116 are aligned with respective contacts 106. Equipment for heating and pressing together printed circuits 20 and 22 such as hot bar equipment 110 and 112 may press printed circuit 22 downwards in direction 114 and/or may press printed circuit 20 upwards in direction 116. As shown in FIG. 26, portions 108' of anisotropic conductive film 108 become conductive under heat and pressure from hot bar equipment 110 and 112 (in the vertical direction between opposing contacts) while the remaining portions of film 108 remain insulating. This shorts each contact 106 on printed circuit 20 to a respective aligned one of contacts 116 on printed circuit 22 and forms a completed connection between the signal paths of printed circuit 20 and printed circuit 22.

Figure 27:
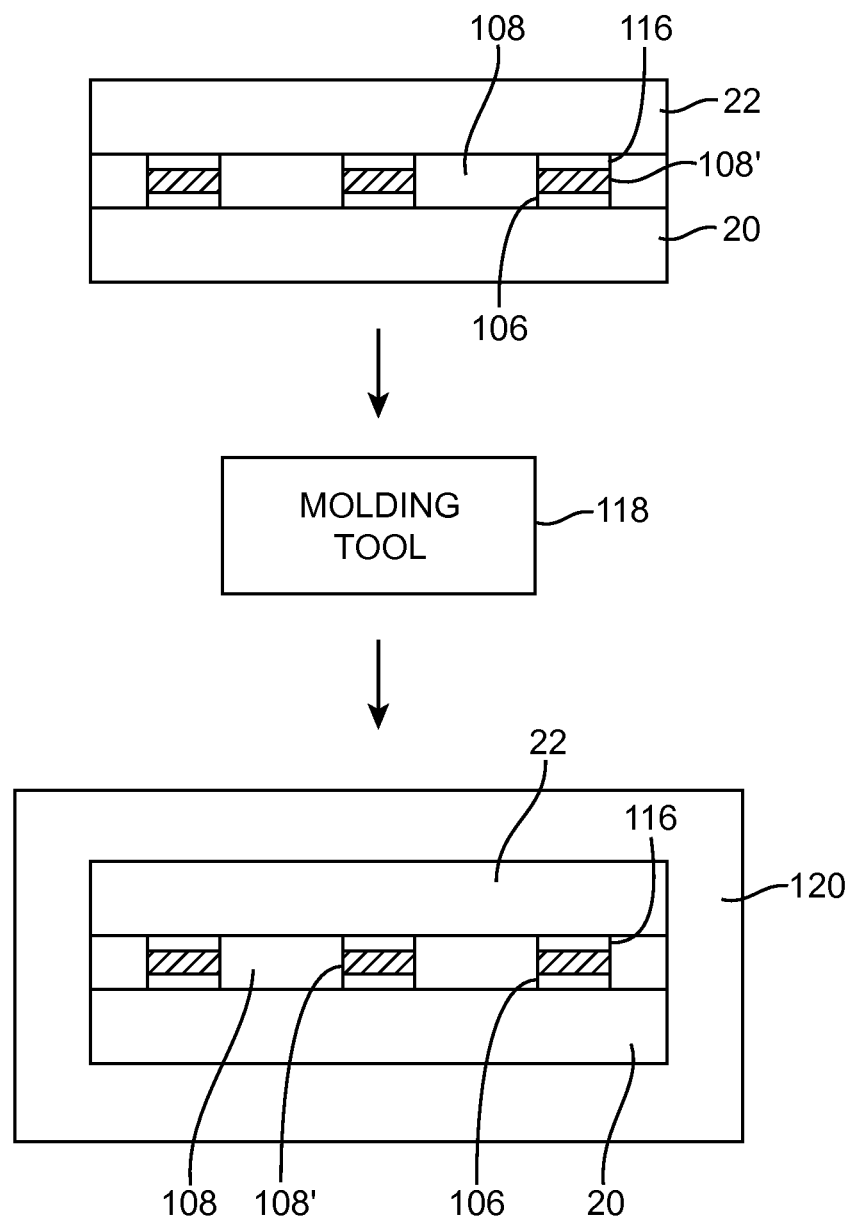
FIG. 27 is a diagram showing how a pair of connected printed circuits of the type shown in FIG. 26 may be embedded within a molded plastic structure that provides the printed circuits with strain relief in accordance with an embodiment.

Following formation of electrical connections between each of contacts 106 on printed circuit 20 and each corresponding contact 116 on printed circuit 22 as shown in FIG. 26, molded plastic strain relief structures may be formed for printed circuits 20 and 22. Molded plastic strain relief structures 120 may, for example, be molded over the structures of FIG. 26 using molding tool 118 of FIG. 27. Molded plastic 120 may be a material such as silicone, polycarbonate, or other suitable plastic. If desired, plastic 120 may be formed from an elastomeric polymer material (e.g., silicone) so the printed circuits 20 and 22 retain some flexibility in the vicinity of the connection formed through portions 108' of anisotropic conductive film 108. Plastic 120 may include conductive filler such as metal particles or other conductive particles. By providing plastic 120 with conductive filler so that plastic 120 is conductive, plastic 120 may form an integral electromagnetic interference shielding structure for the connection formed between printed circuits 20 and 22.

Figure 28:
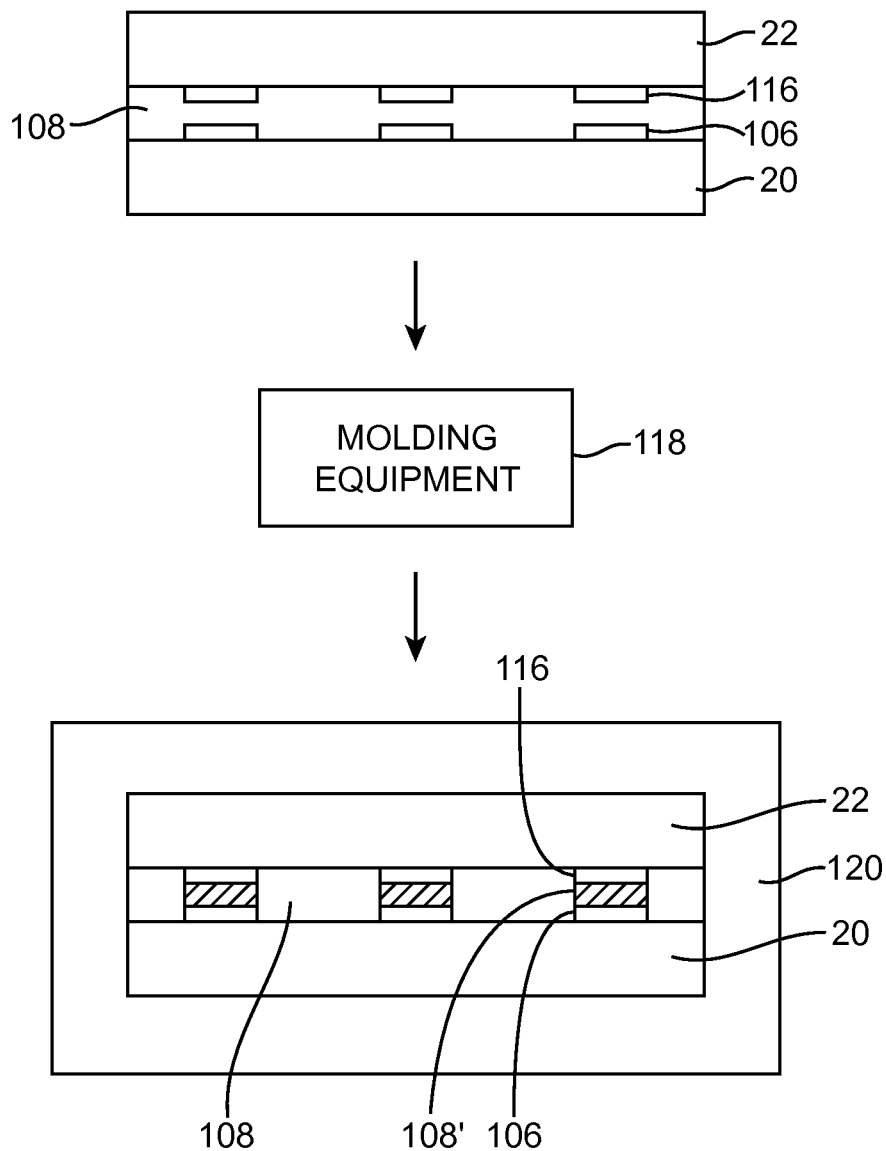
FIG. 28 is a diagram showing how signal connections between a pair of printed circuits can be formed using anisotropic conductive film as part of a process of molding a layer of plastic around the pair of printed circuits to provide the printed circuits with strain relief in accordance with an embodiment.

If desired, the heat and pressure that is used to activate anisotropic conductive film 108 to form electrical connections 108' between opposing contacts 106 and 116 may be applied to printed circuits 20 and 22 as part of a plastic molding process that is used to apply strain relief structures to printed circuits 20 and 22. This type of approach for forming electrical connections and strain relief structures for printed circuits 20 and 22 is shown in FIG. 28. As shown in FIG. 28, a layer of anisotropic conductive film that has not been subjected to heat and pressure may be placed between printed circuit 20 and printed circuit 22. Equipment 118 (e.g., plastic molding equipment such as a heated press that applies heat and pressure while injecting molding plastic) may then use heat and pressure to mold a layer of plastic 120 around printed circuits 20 and 22. Following molding, the portions of printed circuits 20 and 22 in the vicinity of the connection between printed circuits 20 and 22 are embedded within plastic 120.

The process of applying heat and pressure to printed circuits 20 and 22 during the molding operations performed by equipment 118 transforms portions 108' from an insulating state to a conductive state. Conductive portions 108' are therefore formed as part of the process of molding plastic 120 over printed circuits 20 and 22 using equipment 118 while applying heat and pressing printed circuits 20 and 22 and contacts 106 and 116 together. Following removal of plastic 120 from molding equipment 118, portions 108' may therefore form electrical connections between respective contacts 106 and 116. Plastic 120 may be formed from an elastomeric plastic or other plastic and may, if desired, be formed from a conductive plastic (e.g., an elastomeric plastic or other plastic with conductive filler).

Be embedding printed circuits 20 and 22 within plastic 120, potentially fragile anisotropic conductive film connections 108' between contacts 106 and 116 may be protected from potential damage during movement of printed circuits 20 and 22 (i.e., plastic 120 may serve as strain relief structures for printed circuits 20 and 22). In configurations in which plastic 120 is formed form conductive plastic, the plastic structures may also provide electromagnetic interference shielding.

Multiple layers of material may be used to surround printed circuits 20 and 22. For example, one or more layers of materials such as plastic (thermoset plastic and/or thermoplastic plastic), other dielectrics, metals, other conductors, or other materials may be formed around printed circuits 20 and 22 in the vicinity of the connection between printed circuits 20 and 22. These multiple layers may provide strain relief and/or electromagnetic shielding. For example, one or more shots of molded plastic may be used in providing strain relief. Conductive plastic may be used for one or more of the shots of molded plastic to provide electromagnetic shielding. One or more metal layers may be deposited to provide electromagnetic shielding (e.g., a metal coating may be used instead of a conductive plastic layer or in addition to one or more conductive and/or insulating plastic layers).

Figure 29:
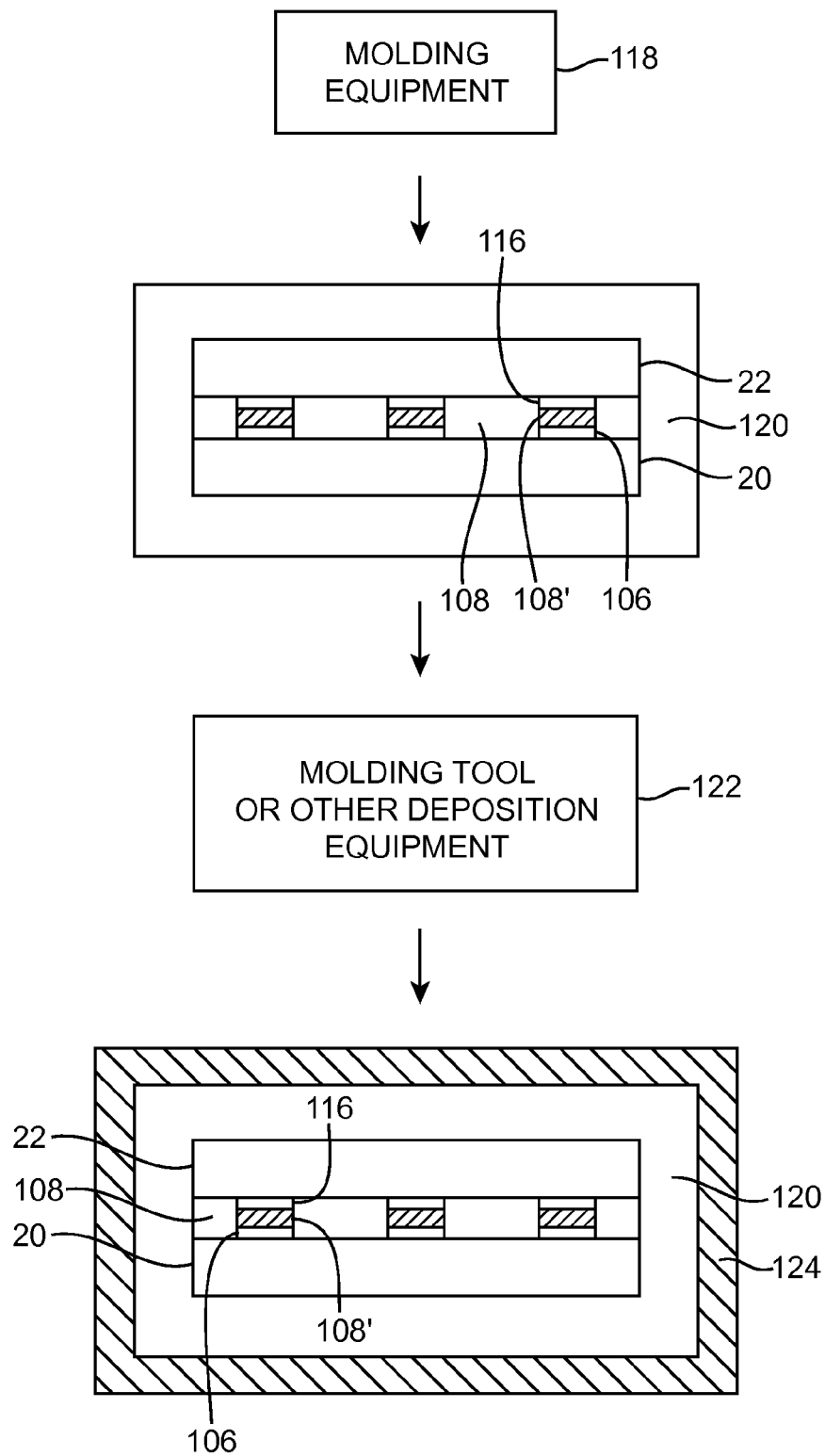
FIG. 29 is a diagram showing how a shielding layer may be formed over printed circuits with molded plastic structures of the type shown in FIG. 28 in accordance with an embodiment.

FIG. 29 is a diagram showing how an outer layer of material such as metal or conductive plastic layer may be formed over printed circuits with molded plastic structures of the type shown in FIG. 28. As shown in FIG. 29, printed circuits 20 and 22 may be embedded within plastic 120 using molding equipment 118 or other equipment for embedding printed circuits 20 and 22 within an integral plastic strain relief structure. Equipment 122 may then be used to form outer layer 124 (e.g., a conductive coating) over layer 120. Equipment 122 may include plastic molding equipment (e.g., plastic injection molding equipment), metal deposition equipment (e.g., physical vapor deposition equipment, electrochemical deposition equipment, etc.), or other equipment for depositing layer 124. Layer 124 may be a metal layer (e.g., a metal coating formed from an elemental metal or a metal alloy) or other conductive layer, a layer of plastic (e.g., a conductive plastic layer), or a coating of other suitable material. In the example of FIG. 29, layer 120 is embedded within layer 124 so that layer 124 covers the entire outer surface of layer 120. If desired, one or more layers such as layer 124 may cover only part of the outer surface of layer 120.

Figure 30:
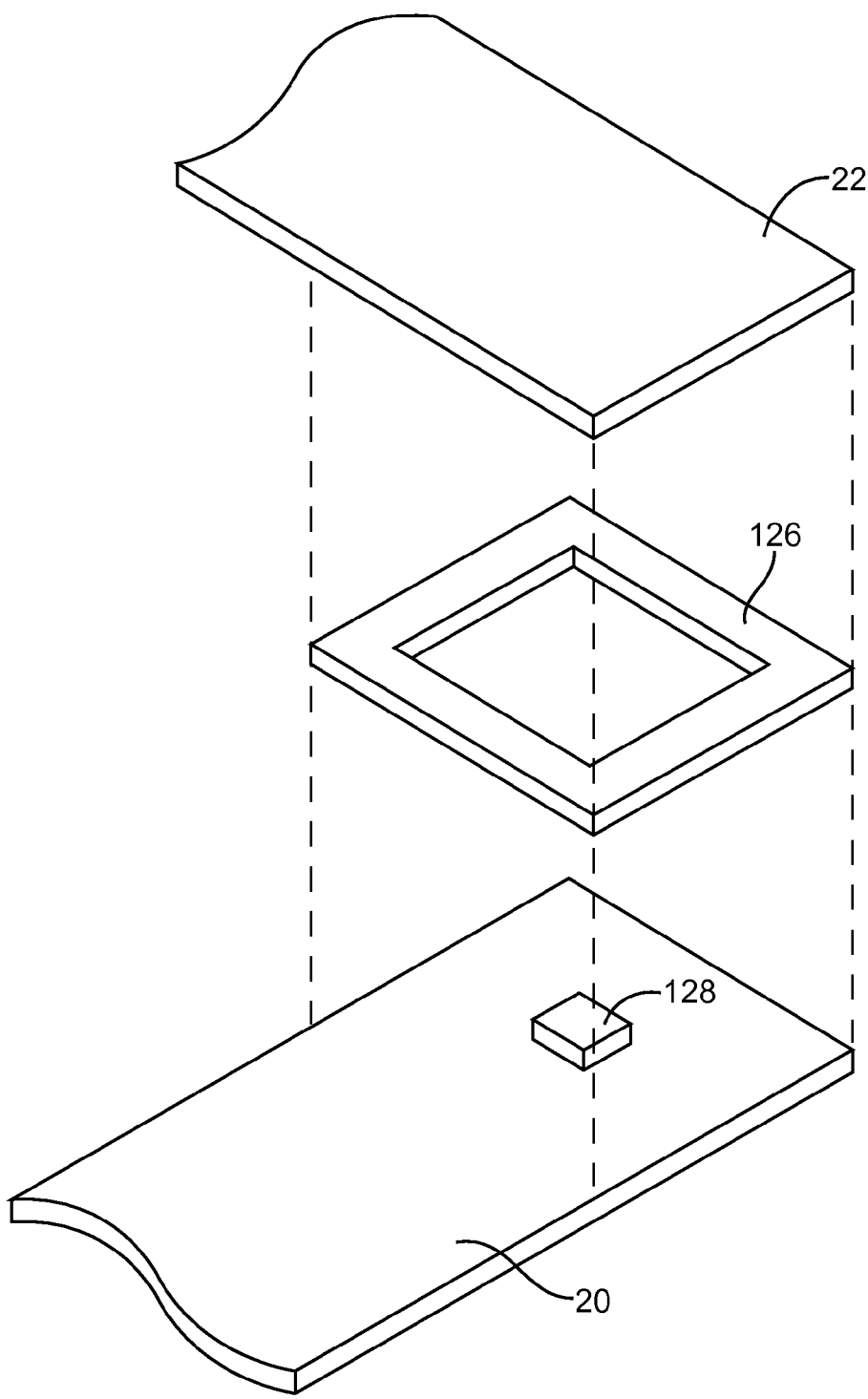
FIG. 30 is an exploded perspective view of a pair of printed circuits and a plastic ring such as an elastomeric ring for surrounding an electrical connection and forming strain relief by forming mechanical supporting structures for the printed circuits in accordance with an embodiment.

Stain relief structures and electromagnetic interference shielding structures may be formed by interposing a plastic ring (e.g., an elastomeric ring) between printed circuits 20 and 22. FIG. 30 is an exploded perspective view of printed circuits 20 and 22 in a configuration in which a plastic ring such as an elastomeric ring (ring 126) is used to surround a connection between the printed circuits such as connection 128. Connection 128 between printed circuits 20 and 22 may be an anisotropic film connection, a solder connection, or a connection implemented using a connector such as a printed circuit board-to-board connector. Plastic ring 126 may be formed from an elastomeric plastic such as silicone or other moldable plastic or may be formed from a thermoset plastic. If desired, plastic ring 126 may be formed from a conductive plastic to help provide electromagnetic interference shielding.

Figure 31:
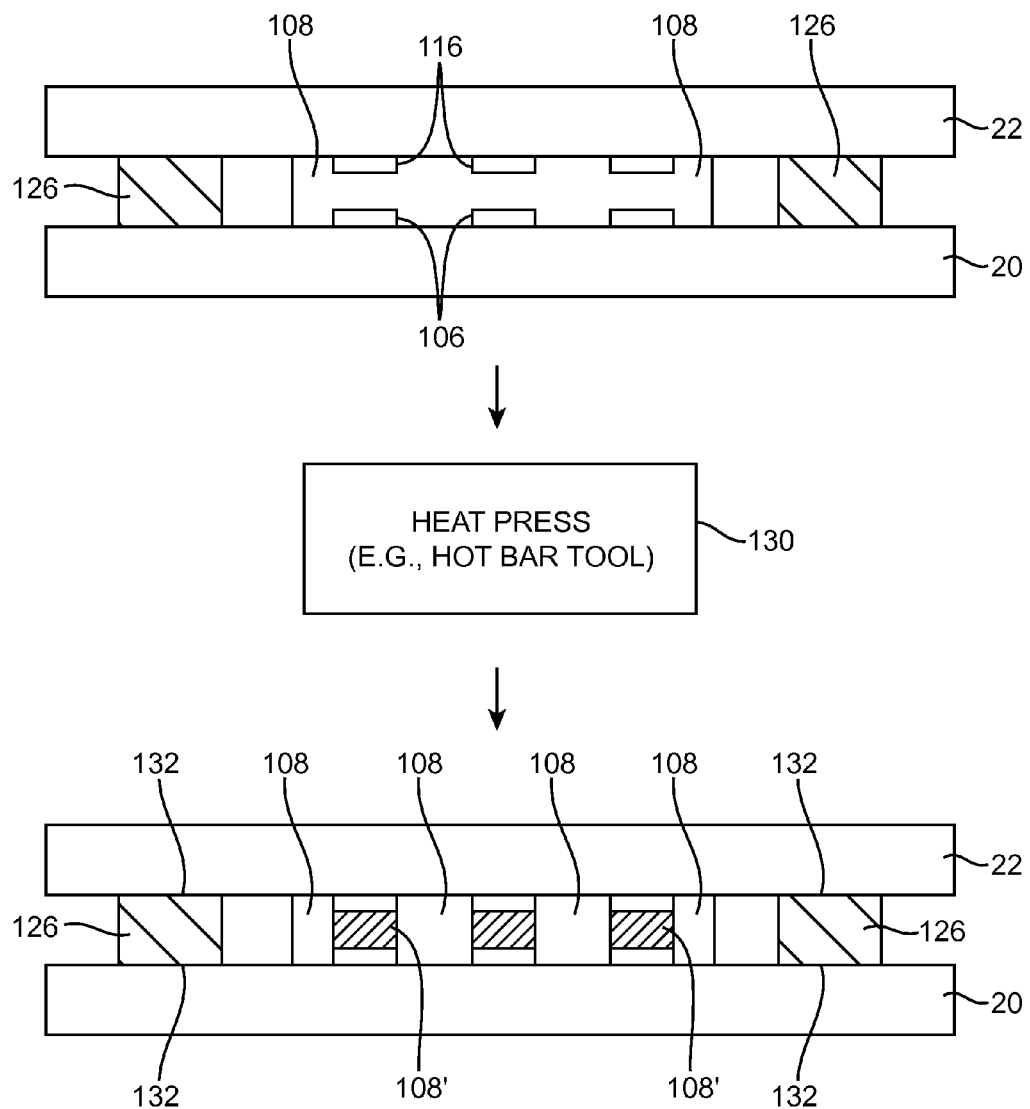
FIG. 31 is a diagram showing how a plastic ring of the type shown in FIG. 30 may be bonded in place between printed circuits during a hot bar process that forms anisotropic conductive film connections between the printed circuits in accordance with an embodiment.
Figure 32:
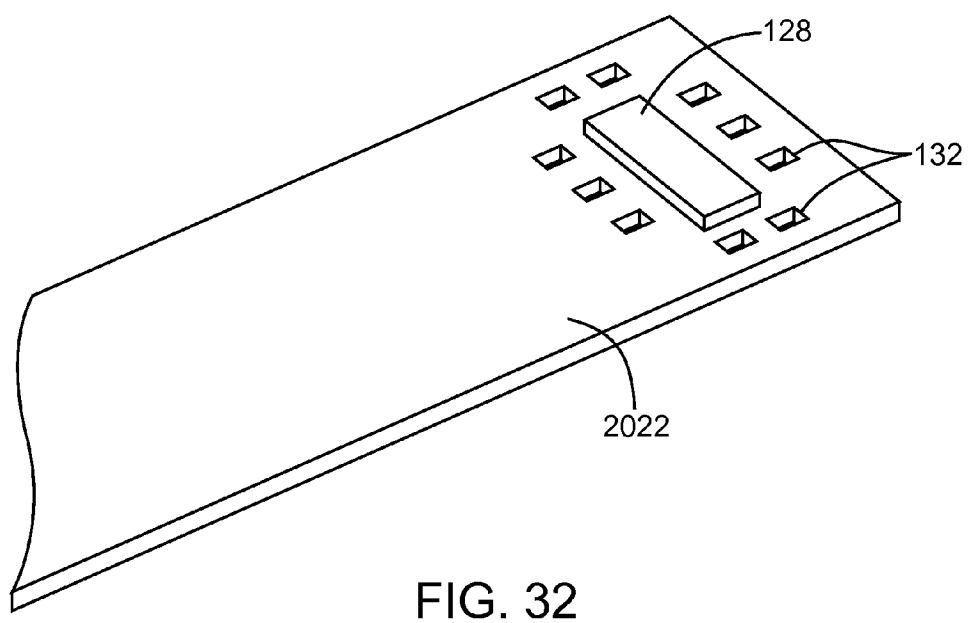
FIG. 32 is a perspective view of a printed circuit that has been provided with features for engaging a plastic ring that is bonded to the printed circuit when providing a pair of coupled printed circuits with strain relief in accordance with an embodiment.

FIG. 31 is a diagram showing how a plastic ring such as plastic ring 126 of FIG. 30 may be molded in place during a hot bar process that forms anisotropic conductive film connections between printed circuits 20 and 22. As shown in the upper portion of FIG. 31, plastic ring 126 may be placed between printed circuits 20 and 22 in a location that surrounds contacts 116 on printed circuit 22 and contacts 106 on printed circuit 20. Plastic ring 126 also runs around the periphery of a layer of anisotropic conductive film 108 that overlaps contacts 116 and 106 and that is interposed between printed circuits 20 and 22.

Heated press 130 (e.g., hot bar equipment or other equipment that applies heat while pressing printed circuits 20 and 22 together), presses downwards on printed circuit 20 while pressing upwards on printed circuit 22. In this way, equipment 130 heats and presses together the first and second printed circuits to form electrical connections between the first and second contacts through the anisotropic conductive film while bonding the plastic ring between the first and second printed circuits. As shown in the lower portion of FIG. 31, the heating and pressing operations performed by equipment 130 form conductive portions 108' in anisotropic conductive film 108 to short together contacts 106 and corresponding contacts 116 while heating plastic ring 126 so that surfaces 132 of ring 126 bond to printed circuits 20 and 22.

To help attach ring 126 to printed circuits 20 and 22, openings may be formed in printed circuit 20 and/or printed circuit 22 such as illustrative openings 132 in printed circuit 2022 (e.g., printed circuit 20 and/or printed circuit 22). Openings 132 may be formed in a ring pattern that surrounds connection 128. When ring 126 is subjected to heat and pressure using equipment such as heated press 130 of FIG. 31, the plastic material of ring 126 flows into openings 132, thereby engaging openings 132 and helping to structurally couple printed circuits 20 and 22. The inclusion of openings 132 or other engagement features therefore helps plastic ring 126 serve as a strain relief structure for the connection formed between printed circuits 20 and 22.

Figure 33:
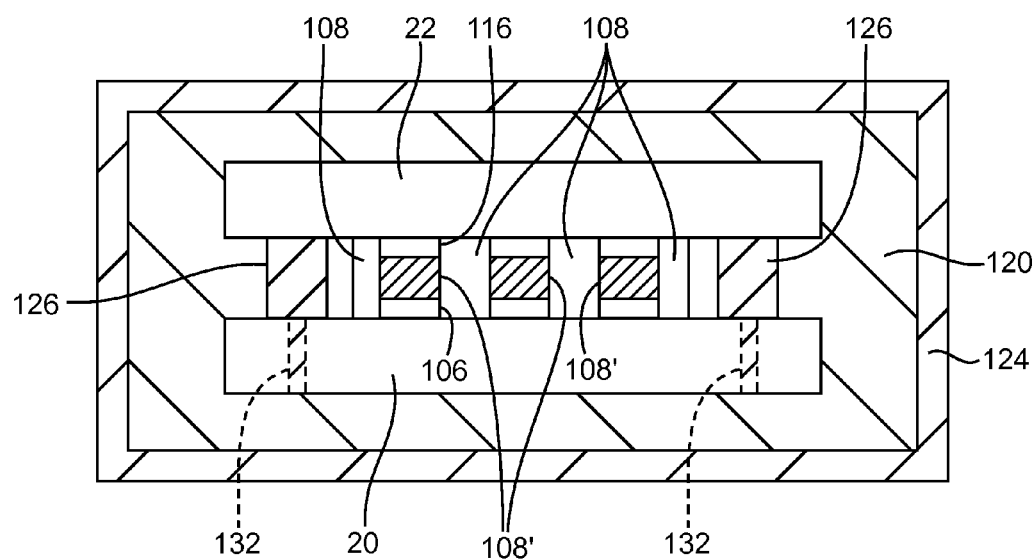
FIG. 33 is a cross-sectional side view of a pair of printed circuits joined using a plastic ring and overmolded layers for strain relief and optional shielding in accordance with an embodiment.

As shown in FIG. 33, one or more additional layers of material may be added to the exterior of printed circuits 20 and 22 after printed circuits 20 and 22 have been joined using plastic ring 126 and the process of FIG. 31. Layer 120 may be a layer of plastic (e.g., elastomeric plastic, conductive plastic, conductive elastomeric plastic, etc.) or may be a layer of metal or other material. Layer 124 may also be may be a layer of plastic (e.g., elastomeric plastic, conductive plastic, conductive elastomeric plastic, etc.) or may be a layer of metal or other material. If desired, layer 124 may be omitted or additional layers of plastic and metal may be formed over the exterior surface of layer 124. The dashed lines in FIG. 33 show how plastic ring 126 may be placed over openings 132 in printed circuit 20 so that some of plastic 126 may protrude into openings 132 during the application of heat and pressure to couple printed circuits 20 and 22.

If desired, conductive structures such as portions 108' may be formed using solder. For example, solder joints may be used in forming conductive structures 108' in FIG. 28 by heating solder (solder paste) during the process of molding plastic layer 120 onto printed circuits 20 and 22 using molding equipment 118 or solder joints may be used in forming conductive structures 108' in FIG. 31 during the process of heating and pressing together printed circuits 20 and 22 to form bonds with plastic ring 126.

Figure 34:
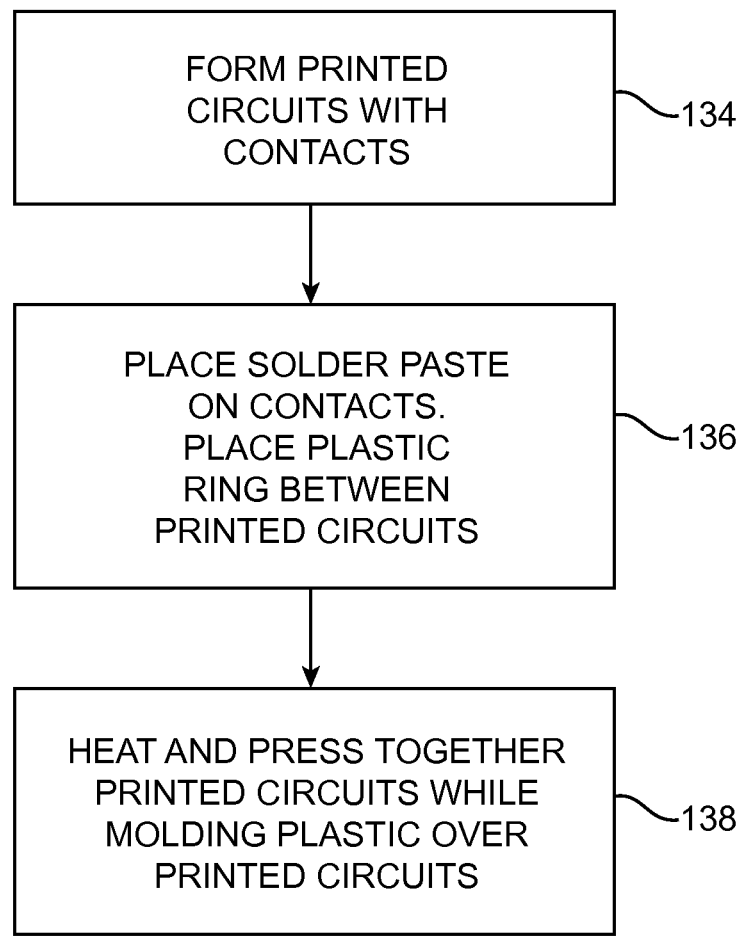
FIG. 34 is a flow chart of illustrative steps involved in forming plastic strain relief structures for printed circuits that are joined by solder joints in accordance with an embodiment.

FIG. 34 is a flow chart of illustrative steps involved in forming plastic strain relief structures for printed circuits in configurations in which solder rather than anisotropic conductive film is used in forming electrical connections 108'. At step 134, printed circuits 20 and 22 may be formed that include signal paths coupled respectively to contacts 106 and contacts 116.

At step 136, screen printing equipment or other equipment may be used to form a patterned layer of solder paste over the contacts (e.g., solder may be provided in the form of solder paste that is deposited over each of contacts 106). Printed circuits 20 and 22 can be aligned so that contacts 106 face contacts 116. Solder (solder paste) may be interposed between each contact 106 and each opposing contact 116. Optional plastic ring 126 may be placed between printed circuits 20 and 22 surrounding the electrical connection structures being formed from contacts 106 and 116 and the solder.

At step 138, heat and pressure may be applied (e.g., using hot bar equipment 130 of FIG. 31 and/or molding equipment 118). The heat and pressure reflows the solder paste to form solder joints between each pair of contacts 106 and 116. In configurations in which plastic ring 126 is present, the heat and pressure that is used to bond plastic ring 126 to printed circuits 20 and 22 to form a strain relief structure is also used to reflow the solder paste to form solder joints between the contacts on printed circuits 20 and 22. Plastic layer 120 may, if desired, be molded over printed circuits 20 and 22 to form a strain relief structure while the heat and pressure that is used in molding layer 120 is being used to form the solder joints.

During the operations of step 138, plastic layer 120 may be molded over printed circuits 20 and 22 while plastic ring 126 is present and is being bonded between printed circuits 20 and 22 or may be molded over printed circuits 20 and 22 in a configuration in which plastic ring 126 has been omitted. If desired, additional layers of material (e.g., plastic, metal, conductive plastic, etc.) may be formed on top of plastic 120 as described in connection with layer 124 of FIG. 29.

In general, electrical connection structures that electrically connect respective signal lines in the signal paths of printed circuits 20 and 22 may be formed using printed circuit connectors such as printed circuit board-to-board connector, joints formed from conductive adhesive such as anisotropic conductive film, joints formed from solder, other suitable conductive materials, or combinations of two or more of these types of structures. The configurations described in connection with FIG. 34 are merely illustrative.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
    a first printed circuit having first signal paths;
    a second printed circuit having second signal paths;
    electrical connection structures that couple the first and second signal paths, wherein the electrical connection structures are interposed between the first and second signal paths, wherein the electrical connection structures comprise a first connector mounted to the first printed circuit and a second connector mounted to the second printed circuit, and wherein the first connector is coupled to the second connector, wherein the second connector is interposed between the first connector and the second printed circuit; and
    a ring-shaped conductive electromagnetic interference shielding structure that is interposed between the first and second printed circuits and that surrounds the electrical connection structures.

2. The apparatus defined in claim 1 wherein the electrical connection structures comprise a printed circuit board-to-board connector.

3. The apparatus defined in claim 1 wherein the electrical connection structures comprise metal traces joined by a material selected from the group consisting of: anisotropic conductive film and solder.

4. The apparatus defined in claim 1 wherein the ring-shaped conductive electromagnetic interference shielding structure comprises conductive polymer.

5. The apparatus defined in claim 1 wherein the ring-shaped conductive electromagnetic interference shielding structure comprises resilient rectangular ring structures.

6. The apparatus defined in claim 1 wherein the ring-shaped conductive electromagnetic interference shielding structure comprises multiple layers of metal interposed between multiple respective layers of foam.

7. The apparatus defined in claim 1 further comprising openings in the second printed circuit and a metal bracket that has portions that pass through the openings.

8. The apparatus defined in claim 1 wherein the first connector comprises a first contact pin coupled to the first signal paths and the second connector comprises a second contact pin coupled to the second signal paths, and wherein the first contact pin is coupled to the second contact pin.

9. The apparatus defined in claim 1 wherein the first connector comprises a first plastic body and a first set of contact pins, and wherein the second connector comprises a second plastic body and a second set of contact pins that mate with the first set of contact pins.

10. Apparatus, comprising:
    a first printed circuit having first signal paths;
    a second printed circuit having second signal paths;
    electrical connection structures that couple the first and second signal paths; and
    a ring-shaped, conductive, resilient electromagnetic interference shielding structure that is interposed between the first and second printed circuits and that surrounds the electrical connection structures, wherein the ring-shaped, conductive, resilient electromagnetic interference shielding structure comprises first and second opposing surfaces, a peripheral side surface, and a metal layer on the first surface and at least one of the second surface and the peripheral side surface.

11. The apparatus defined in claim 10 further comprising a metal trace on the first printed circuit that surrounds the electrical connection structures, wherein the ring-shaped, conductive, resilient electromagnetic interference shielding structure is shorted to the metal trace on the first printed circuit.

12. The apparatus defined in claim 10 wherein the metal layer is a rectangular metal layer, the apparatus further comprising solder that couples the rectangular metal layer to the metal trace on the first printed circuit.

13. The apparatus defined in claim 12 further comprising a metal trace on the second printed circuit that is shorted to the ring-shaped, conductive, resilient electromagnetic interference shielding structure.

14. The apparatus defined in claim 13 wherein the metal trace on the second printed circuit has a rectangular ring shape that surrounds the electrical connection structures.

15. The apparatus defined in claim 14 wherein the electrical connection structures comprise a printed circuit board-to-board connector.

16. The apparatus defined in claim 15 wherein the first printed circuit comprises a rigid printed circuit board and wherein the second printed circuit comprises a flexible printed circuit, the apparatus further comprising a metal bracket that covers at least part of the flexible printed circuit.

17. The apparatus defined in claim 16 further comprising screws that hold the metal bracket in place on the flexible printed circuit, wherein the screws do not extend through the flexible printed circuit.

18. The apparatus defined in claim 16 further comprising stiffening structures interposed between the metal bracket and the flexible printed circuit.

19. The apparatus defined in claim 10 wherein the ring-shaped conductive electromagnetic interference shielding structure comprises a rectangular foam ring, wherein the peripheral side surface is covered with patterned metal having openings, and wherein the openings are completely surrounded by the patterned metal layer.

20. Apparatus, comprising:
a first printed circuit having first signal paths;
a second printed circuit having second signal paths;
electrical connection structures that couple the first and second signal paths; and
ring-shaped conductive electromagnetic interference shielding structures that are interposed between the first and second printed circuits and that surround the electrical connection structures, wherein the ring-shaped conductive electromagnetic interference shielding structures comprise metal spring structures.

21. The apparatus defined in claim 20 wherein the metal spring structures are coupled to ground signal paths on the first and second printed circuits.

22. The apparatus defined in claim 20 wherein the metal spring structures comprise a rectangular ring-shaped metal spring that surrounds the electrical connection structures.

23. The apparatus defined in claim 20 wherein the metal spring structures comprise a plurality of separate, metal springs that surround the electrical connection structures, wherein each of the plurality of separate, metal springs are separated from one another by a plurality of respective gaps.

* * * * *